United States Patent
Schrems et al.

(10) Patent No.: US 11,411,035 B2
(45) Date of Patent: Aug. 9, 2022

(54) SYSTEM-ON-CHIP CAMERA WITH INTEGRATED LIGHT SENSOR(S) AND METHOD OF PRODUCING A SYSTEM-ON-CHIP CAMERA

(71) Applicant: ams AG, Premstaetten (AT)

(72) Inventors: Martin Schrems, Eggersdorf (AT); Thomas Stockmeier, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/309,226

(22) PCT Filed: Jun. 13, 2017

(86) PCT No.: PCT/EP2017/064421
§ 371 (c)(1),
(2) Date: Dec. 12, 2018

(87) PCT Pub. No.: WO2017/216164
PCT Pub. Date: Dec. 21, 2017

(65) Prior Publication Data
US 2019/0312076 A1  Oct. 10, 2019

(30) Foreign Application Priority Data

Jun. 16, 2016 (EP) .................................. 16174805

(51) Int. Cl.
*H01L 27/146* (2006.01)
*G02B 5/20* (2006.01)

(52) U.S. Cl.
CPC ........ *H01L 27/14634* (2013.01); *G02B 5/208* (2013.01); *H01L 27/1465* (2013.01);
(Continued)

(58) Field of Classification Search
CPC ................................................. H01L 27/14647
See application file for complete search history.

(56) References Cited

U.S. PATENT DOCUMENTS 7,875,947 B2   1/2011   Moon et al.
8,284,291 B2  10/2012   Huang et al.
(Continued)

FOREIGN PATENT DOCUMENTS

EP          2230691       9/2010
EP          3032583       6/2016
WO       2015/151790     10/2015

OTHER PUBLICATIONS

Wang, 2016, WO 2016/171733A1.*
European Patent Office, International Search Report for PCT/EP2017/064421 dated Sep. 15, 2017.

*Primary Examiner* — Suberr L Chi
(74) *Attorney, Agent, or Firm* — MH2 Technology Law Group LLP

(57) ABSTRACT

The system-on-chip camera comprises a semiconductor body (1) with an integrated circuit (40), a sensor substrate (2), sensor elements (3) arranged in the sensor substrate according to an array of pixels, a light sensor (4) in the sensor substrate apart from the sensor elements, and a lens or an array of lenses (15) on a surface of incidence (30). Filter elements (11, 12, 13), which may especially be interference filters for red, green or blue, are arranged between the sensor elements and the surface of incidence.

18 Claims, 18 Drawing Sheets

(52) U.S. Cl.
CPC ...... *H01L 27/1467* (2013.01); *H01L 27/1469* (2013.01); *H01L 27/14621* (2013.01); *H01L 27/14627* (2013.01); *H01L 27/14652* (2013.01)

(56) References Cited

U.S. PATENT DOCUMENTS

| | | |
|---|---|---|
| 8,964,062 B1 | 2/2015 | Neglur |
| 9,232,150 B2 | 1/2016 | Kleekajai et al. |
| 2006/0138500 A1 | 6/2006 | Kim |
| 2008/0122960 A1 | 5/2008 | Liu et al. |
| 2011/0115004 A1 | 5/2011 | Gebara et al. |
| 2011/0298074 A1 | 12/2011 | Funao |
| 2012/0056073 A1 | 3/2012 | Ahn |
| 2014/0022650 A1 | 1/2014 | Wolterink et al. |
| 2014/0199803 A1* | 7/2014 | Kurihara ........... H01L 27/14621 438/70 |
| 2015/0115413 A1* | 4/2015 | Rudmann ......... H01L 27/14625 257/622 |
| 2015/0303233 A1 | 10/2015 | Borthakur et al. |
| 2015/0318323 A1 | 11/2015 | Borthakur et al. |
| 2016/0006913 A1 | 1/2016 | Ketunnen et al. |
| 2016/0182846 A1 | 1/2016 | Wan |
| 2016/0181226 A1 | 6/2016 | Wan |

* cited by examiner

SYSTEM-ON-CHIP CAMERA WITH INTEGRATED LIGHT SENSOR(S) AND METHOD OF PRODUCING A SYSTEM-ON-CHIP CAMERA

BACKGROUND OF THE INVENTION

In a system on chip (SoC) all components of an electronic system or device are integrated into or onto a single chip.

U.S. Pat. No. 7,875,947 B2 discloses color filters formed of alternately stacked inorganic materials of different refractive indices like $SiO_2$, SiON, SiN or Si.

U.S. Pat. No. 8,284,291 B2 discloses an optical lens assembly comprising a lens with a concave surface on the side of the image, the surface having at least one inflection point.

U.S. Pat. No. 8,964,062 B1 discloses a camera of a computing device with an integrated ambient light sensor in the camera module. A microprocessor analyzes data obtained from the sensor.

U.S. Pat. No. 9,232,150 B2 discloses a system for calculating an ambient light estimate using an image sensor and a matrix of grid elements each comprised of multiple adjacent pixels.

US 2014/0022650 A1 discloses an optical unit comprising two lenses arranged between two substrates for use in image processing units like cameras.

US 2016/0006913 A1 discloses an optical apparatus comprising a semiconductor substrate with an image sensor and an ambient light sensor and/or proximity sensor, and an optics substrate with a lens element.

SUMMARY OF THE INVENTION

The system-on-chip camera comprises a sensor substrate comprising semiconductor material, sensor elements arranged in the sensor substrate according to an array of pixels, a light sensor in the sensor substrate apart from the sensor elements, and a surface of incidence above the sensor elements and the light sensor. The sensor substrate is connected to a semiconductor body comprising an integrated circuit and is arranged between the semiconductor body and the surface of incidence. Each of the sensor elements is provided with a further component arranged between the sensor element and the surface of incidence, the further component being a filter element or a stack of further sensor elements.

In an embodiment of the system-on-chip camera, a front dielectric layer is arranged between the sensor substrate and the surface of incidence, and each of the further components is a filter element arranged in the front dielectric layer. Each of the filter elements may especially be a band-pass filter for either red, green or blue light.

In a further embodiment, metal spacers are laterally arranged at the filter elements or further sensor elements.

In a further embodiment, a further band-pass filter for either red, green or blue light is arranged as a filter layer between the light sensor and the surface of incidence.

In a further embodiment, each of the further components is a stack of further sensor elements, the sensor element and the further sensor elements being arranged at different distances from the surface of incidence.

In a further embodiment, a lens or an array of lenses is formed by an oxide of semiconductor material arranged on the surface of incidence.

In a further embodiment, a molding material covers the lens or array of lenses, and a diffusor is formed above the light sensor by a modified region of the molding material.

A further embodiment comprises a metallization layer between the semiconductor body and the sensor substrate, a contact pad, a via hole in the semiconductor body, and a metallization in the via hole. The semiconductor body is between the metallization layer and the contact pad. The metallization in the via hole electrically connects the metallization layer and the contact pad.

A further embodiment comprises a metallization layer between the semiconductor body and the sensor substrate, an optical component above the surface of incidence and a through-substrate interconnection electrically connecting the metallization layer and the optical component.

A further embodiment comprises an optical via penetrating the semiconductor body and an optical component opposite the optical via on a side facing away from the sensor substrate. In further embodiments the light sensor is a sensor selected from the group consisting of ambient light sensor, color sensor, hyperspectral sensor with multiple pixels or bands, infrared sensor and UV sensor.

A further embodiment comprises a proximity sensor, a gesture sensor or a time-of-flight sensor including a light source.

In a further embodiment the light sensor comprises an array of light sensors serving as a further camera.

In one aspect the method of producing a system-on-chip camera comprises providing a semiconductor body with an integrated circuit, providing a sensor substrate with sensor elements, which are arranged according to an array of pixels, and with a light sensor apart from the sensor elements, fastening the sensor substrate to the semiconductor body, and forming at least one plurality of filter elements. Each plurality of filter elements is formed by arranging a filter layer on a planar surface above the sensor substrate, applying a mask on the filter layer, the mask covering areas provided for the filter elements, structuring the filter layer using the mask, and planarizing the surface.

In particular three pluralities of filter elements may be provided for the system-on-chip camera by arranging a first filter layer on the sensor substrate, applying a first mask on the first filter layer, the first mask covering areas provided for filter elements of a first type, structuring, especially etching, the first filter layer using the first mask, planarizing the surface, arranging a second filter layer on the planarized surface, applying a second mask on the second filter layer, the second mask covering areas provided for filter elements of a second type, structuring, especially etching, the second filter layer using the second mask, planarizing the surface, arranging a third filter layer on the planarized surface, applying a third mask on the third filter layer, the third mask covering areas provided for filter elements of a third type, structuring, especially etching, the third filter layer using the third mask, and planarizing the surface.

In a variant of this method, a UV IR blocking filter layer is arranged on the planarized surface after the last filter layer is etched. A further mask is applied on the UV IR blocking filter layer, the UV IR blocking filter layer is etched using the further mask, and the surface is planarized.

In a further variant of this method, a lens layer is arranged above the sensor substrate, and a transfer mask having the shape of a lens or an array of lenses, is applied on the lens layer. A lens or an array of lenses is formed by transferring the shape of the transfer mask to the lens layer.

In a further aspect the method of producing a system-on-chip camera comprises providing a semiconductor body with an integrated circuit, providing a sensor substrate with sensor elements, which are arranged according to an array of pixels, and with a light sensor apart from the sensor elements, fastening the sensor substrate to the semiconductor body, and arranging a lens or an array of lenses above the sensor substrate. The lens or array of lenses may be formed by arranging a lens layer above the sensor substrate, applying a transfer mask on the lens layer, the transfer mask having a shape of a lens or an array of lenses, and forming a lens or an array of lenses by transferring the shape of the transfer mask to the lens layer.

In a further variant of the method, a molding material is applied to cover the lens or array of lenses, and a diffusor is formed above the light sensor by modifying the molding material in a region above the light sensor.

In a further variant of the method, metal spacers are formed at the filter elements by etching trenches in the planarized surface and filling the trenches with a metal.

The following is a detailed description of embodiments of the system-on-chip camera with integrated light sensor and the method of producing a system-on-chip camera in conjunction with the appended figures.

DETAILED DESCRIPTION

Figure 1:
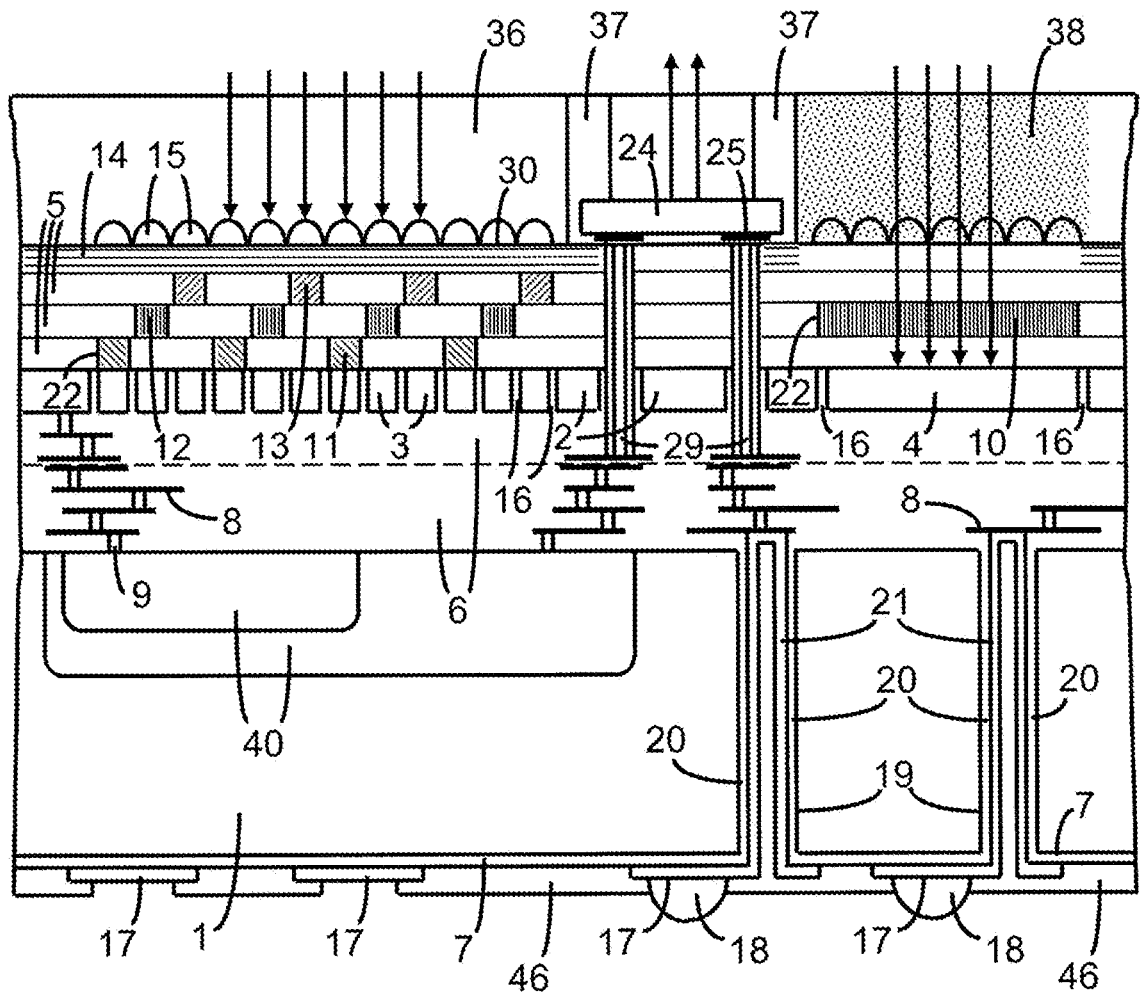
FIG. 1 is a cross section of a system-on-chip camera with filters, light sensor, vias and molding material.

FIG. 1 is a cross section of a system-on-chip camera with an integrated light sensor. A semiconductor body 1 is fastened to a sensor substrate 2 comprising semiconductor material, which may be of the same kind as the semiconductor material of the semiconductor body 1, in particular silicon, for instance. Sensor elements 3 are arranged in the sensor substrate 2 according to an array of pixels, and at least one light sensor 4 is arranged in the sensor substrate 2 apart from the sensor elements 3. FIG. 1 shows one light sensor 4 by way of example, but two or more light sensors 4 may be integrated. The sensor elements 3 may be separated from one another and from the sensor substrate 2 by deep trench isolations 16, for instance. The light sensor 4 may be separated from the sensor substrate 2 by deep trench isolations 16, for instance.

A front dielectric layer 5 may be present on the front side of the sensor substrate 2 facing away from the semiconductor body 1. An intermediate dielectric layer 6 may be arranged between the semiconductor body 1 and the sensor substrate 2. The intermediate dielectric layer 6 may comprise a layer portion that is applied to the semiconductor body 1 and a further layer portion that is applied to the sensor substrate 2 before the sensor substrate 2 is fastened to the semiconductor body 1. The boundary between these layer portions is indicated in FIG. 1 by a horizontal broken line. The layer portions may serve to fasten the sensor substrate 2 to the semiconductor body 1 by bonding. A rear dielectric layer 7 may be present on the side of the semiconductor body 1 facing away from the sensor substrate 2. The intermediate dielectric layer 6 may include a wiring comprising structured metallization layers 8 and vertical interconnections 9. The wiring may especially be connected to the array of sensor elements 3, the light sensor 4 and/or components of an integrated circuit 40 in the semiconductor body 1. Details of the integrated circuit 40 are not essential, and the integrated circuit 40 is therefore only schematically indicated in FIG. 1 by doped wells. The integrated circuit 40 may in particular be a CMOS circuit, for instance.

In the system-on-chip camera according to FIG. 1, filter elements 11, 12, 13 are arranged above the sensor elements 3. It may be suitable to arrange filter elements of the same type of filter on the same level above the sensor elements 3. A filter layer 10 may be arranged above the light sensor 4. The filter layer 10 may be a band-pass filter for either red, green or blue light. Filter elements of a first type 11 may be arranged in a first layer portion of the front dielectric layer 5, filter elements of a second type 12 may be arranged in a second layer portion of the front dielectric layer 5, and filter elements of a third type 13 may be arranged in a third layer portion of the front dielectric layer 5. The filter elements of the first type 11 may be band-pass filters for red, the filter elements of the second type 12 may be band-pass filters for green, and the filter elements of the third type 13 may be band-pass filters for blue, for example. The order of the levels on which filter elements of the same type, especially red, green or blue filters, are arranged is arbitrary. The optional filter layer 10 may be on the same level with the filter elements of any of the types 11, 12, 13. The band-pass filters may be formed by interference filters, for instance.

The number of levels on which filter elements are arranged may differ from the system-on-chip camera shown in FIG. 1 and may especially be larger. Further types of filters may be arranged in the system-on-chip camera, in particular filters that are provided to protect the integrated circuit from radiation.

A UV IR blocking filter 14 is optionally arranged above the filter elements 11, 12, 13. The UV IR blocking filter 14, which prevents ultraviolet and infrared radiation from reaching the sensor elements 3, may be an interference filter comprising a sequence of layers, which are schematically indicated in FIG. 1. The UV IR blocking filter 14 may form an entire layer, or it may be recessed above the light sensor 4, as shown in FIG. 1 by way of example. Another type of filter may be employed instead of the UV IR blocking filter 14, in particular a filter that blocks either ultraviolet radiation or infrared radiation, according to the intended application.

The light sensor 4 can be an ambient light sensor, a color sensor with three pixels or bands (RGB or XYZ), for instance, a hyperspectral sensor (on-chip spectrometer) with multiple pixels or bands (e.g. more than 3 and up to 256), an IR sensor above which the UV IR blocking layer 14 is opened or an UV sensor above which the UV IR blocking layer 14 is opened. Applications include any system-on-chip combining a camera with such sensors. Further to the light sensor 4, the system-on-chip camera may comprise a proximity sensor, a gesture sensor or a time-of-flight sensor including a light source, especially for emitting and detecting IR radiation, and optical barriers. The light sensor 4 may have multiple pixels forming an array serving as a further camera.

A surface of incidence 30 is provided on a side of the sensor substrate 2 facing away from the semiconductor body 1, where radiation is allowed to enter the system-on-chip camera in the direction indicated in FIG. 1 by the arrows pointing downwards. A lens 15 or an array of lenses 15 is applied on the surface of incidence 30 above the array of sensor elements 3 and may especially be formed in a layer of transparent or semitransparent material, which may be an oxide of the semiconductor material of the sensor substrate 2, in particular $SiO_2$, for instance. The lens 15 or array of lenses 15 may also be arranged above the light sensor 4 as shown in FIG. 1 by way of example.

Contact pads 17 or a redistribution layer may be arranged on the rear side of the semiconductor body 1, facing away from the sensor substrate 2. Solder balls 18 may be arranged on at least some of the contact pads 17 for external electric connection. A passivation 46, which does not completely cover the contact pads 17, may also be applied on the rear side.

A via hole 19 or a plurality of via holes 19 may be present in the semiconductor body 1. An electric interconnection between a contact pad 17 and a metallization layer 8 embedded in the intermediate dielectric layer 6 can be formed by a metallization 21, which is arranged in one of the via holes 19. A dielectric interlayer 20 optionally insulates the semiconductor body 1 from the metallization 21 to prevent a short circuit through the semiconductor body 1.

FIG. 1 shows optional metal spacers 22, which can be arranged at lateral surfaces of the filter layer 10 and the filter elements 11, 12, 13 to form apertures limiting the solid angle of incidence. The metal spacers 22 may comprise TiN or W, for instance, and may be formed by chemical vapor deposition and subsequent etching, for instance.

FIG. 1 also shows an arrangement of a further optical component 24. In this example, the optical component 24 is a vertical-cavity surface-emitting laser (VCSEL), but other optical components may be provided in similar fashion. Further contact pads 25 and through-substrate vias 29 may serve as electric connections between terminals of the optical component 24 and metallization layers 8 of the wiring. The direction of light emission from the optical component 24 is indicated in FIG. 1 by arrows pointing upwards.

The lens 15 or array of lenses 15 may be covered by a molding material 36, which is sufficiently transparent or at least semitransparent for radiation within a desired range of wavelengths. An optical isolation 37, which is essentially opaque for the relevant range of wavelengths, in particular for radiation emitted by the optical component 24, may be formed in the molding material 36 to provide an aperture. A diffusor 38 can also be formed in the molding material 36, in particular above the light sensor 4, by a regional modification of the molding material 36, which is known per se. Such a diffusor 38 helps to eliminate shifts in the characteristics of the filter layer 10 that are due to a dependency of the filter characteristics on the angle of incidence of the radiation.

Figure 2:
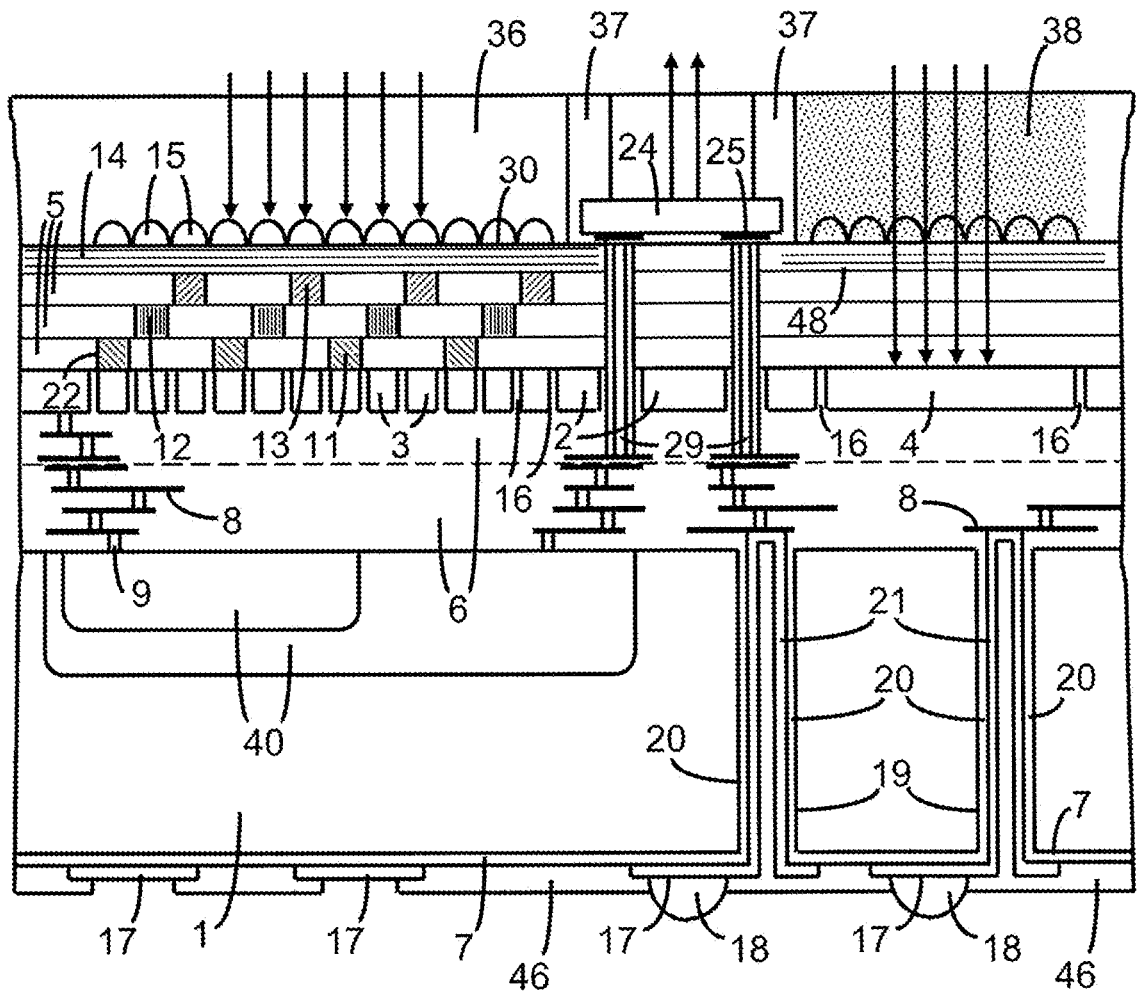
FIG. 2 is a cross section according to FIG. 1 for a system-on-chip camera with a different filter.

FIG. 2 is a cross section according to FIG. 1 for a further system-on-chip camera with an integrated light sensor. The UV IR blocking filter 14 is recessed above the light sensor 4, and a further filter 48 is arranged above the light sensor 4. The further filter 48 may especially be an IR pass filter, which allows infrared radiation to reach the light sensor 4, and/or a UV blocking filter, which prevents ultraviolet radiation from reaching the light sensor 4. The UV IR blocking filter 14 and the further filter 48 may be arranged on the same level, or one of these filters 14, 48 may be on a higher level than the other one.

Figure 3:
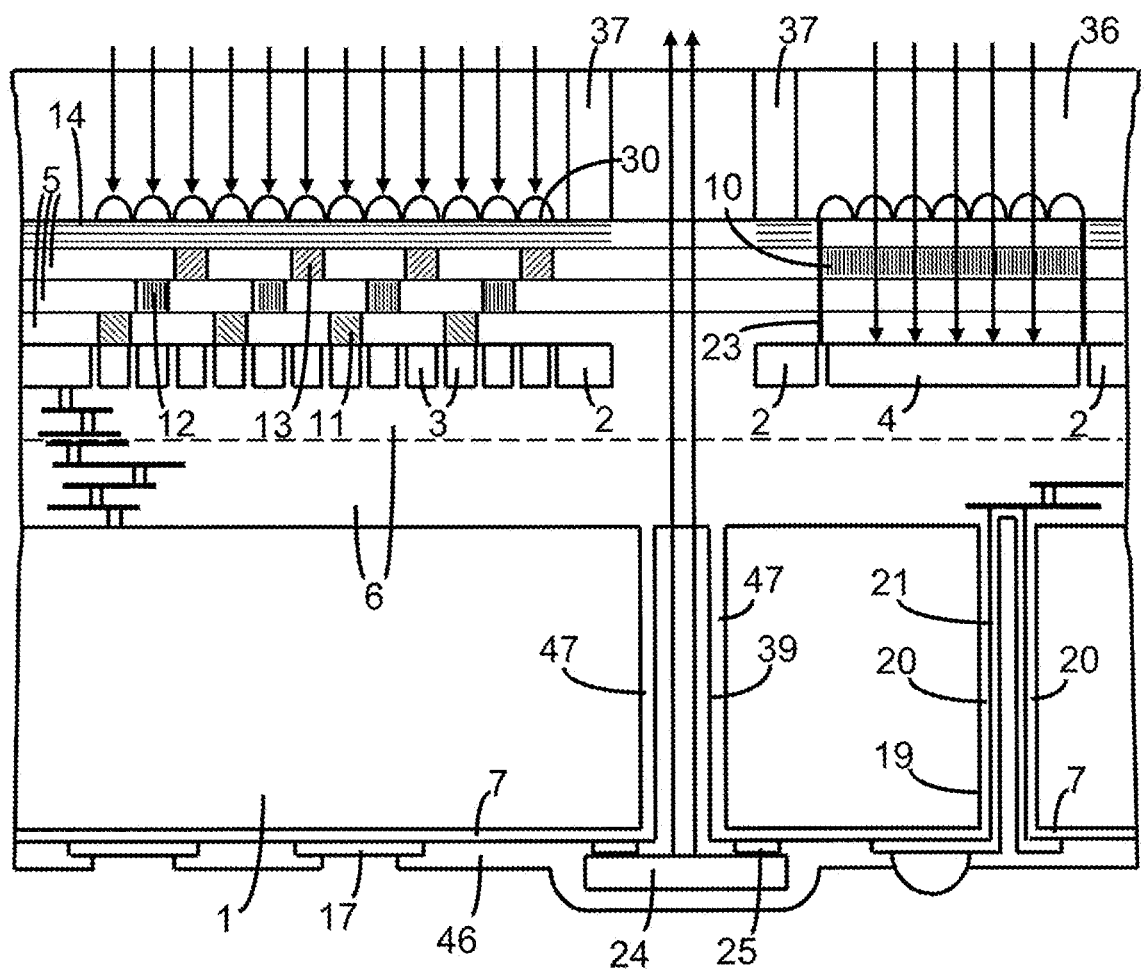
FIG. 3 is a cross section of a system-on-chip camera with filters, light sensor, optical via and molding material.

FIG. 3 is a cross section of a further system-on-chip camera with an integrated light sensor. Elements of the embodiment according to FIG. 3 that are similar to corresponding elements of the embodiment according to FIG. 1 are designated with the same reference numerals. In the embodiment according to FIG. 3, the optical component 24 is arranged on the rear side of the semiconductor body 1. An optical via 39, which may comprise a sidewall insulation 47, is provided in the semiconductor body 1 opposite the optical component 24. The sensor substrate 2 is recessed above the optical component 24. If the optional UV IR blocking filter 14 is present, it is also recessed above the optical component 24. Thus the direction of the radiation emitted by the optical component 24 can be the same as in the embodiment according to FIG. 1. The emitted radiation is indicated in FIG. 3 by the arrows pointing upwards.

FIG. 3 further shows an optical confinement 23 for the light sensor 4. The optical confinement 23 may be a layer surrounding the region that is located above the light sensor 4 and may especially be a metal layer, in particular TiN or W, for instance. The optical confinement 23 may be formed by etching a trench in the front dielectric layer 5 and optionally in the sensor substrate 2, filling the trench with the metal and planarizing the surface. Such an optical confinement 23 may also be provided in the embodiment according to FIG. 1 or FIG. 2. FIG. 3 shows the filter layer 10 arranged on the level of the filter elements 13, by way of example. This level is higher than the level of the filter layer 10 in the arrangements shown in FIGS. 1 and 2. Instead, the filter layer 10 can be arranged on one of the lower levels of the filter elements 11 or 12. A UV IR blocking filter 14 and/or a further filter 48 may be arranged above the light sensor 4 as in the embodiments according to FIG. 1 or 2.

Figure 4:
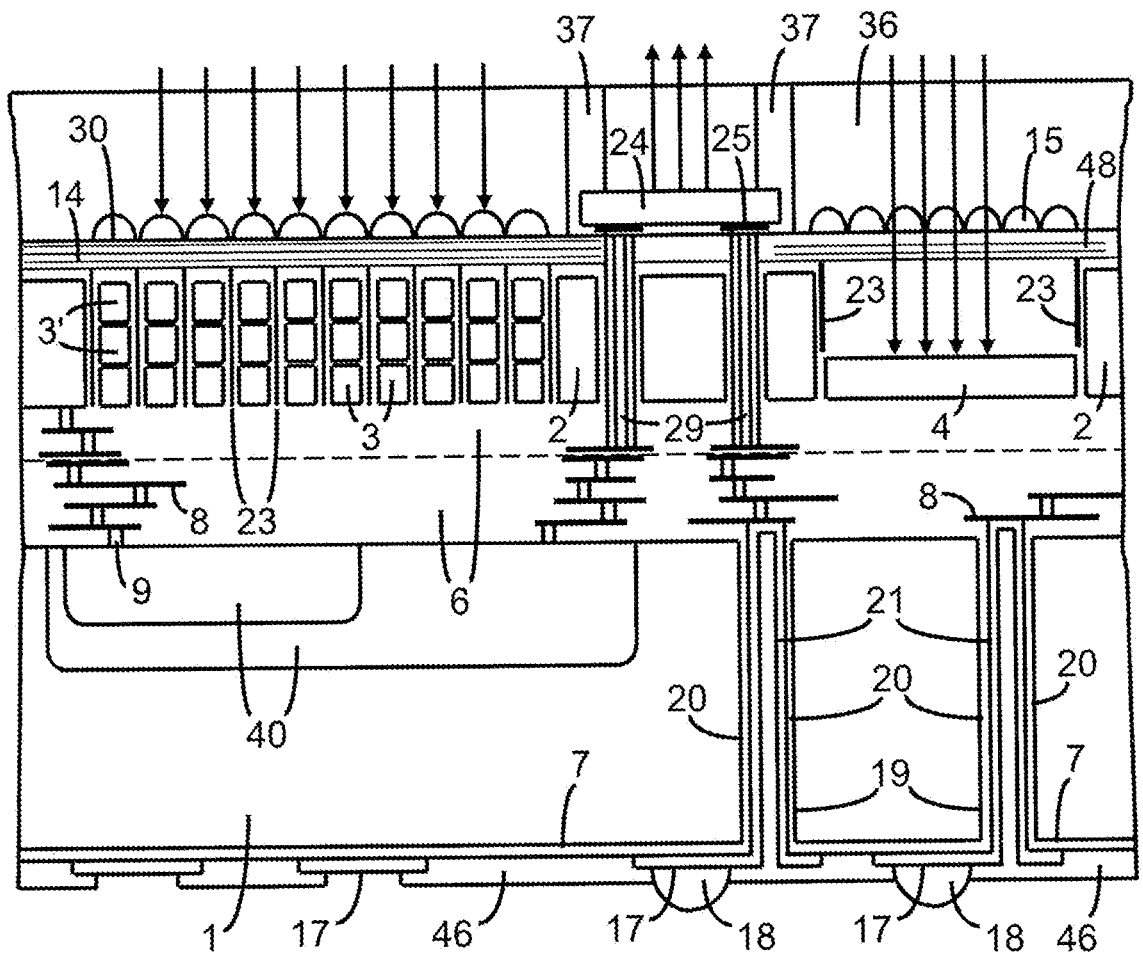
FIG. 4 is a cross section of a system-on-chip camera with sensor stacks, light sensor, vias and molding material.

FIG. 4 is a cross section of a further system-on-chip camera with an integrated light sensor. Elements of the embodiment according to FIG. 4 that are similar to corresponding elements of the embodiments according to FIG. 1 or 2 are designated with the same reference numerals. In the embodiment according to FIG. 4, further sensor elements 3' are arranged above the sensor elements 3 instead of filter elements. The distances of the sensor elements 3 and further sensor elements 3' from the surface of incidence 30 vary in each of the stacks. As the depth of penetration of light into silicon depends on the wavelength, the spectral sensitivities of the sensor element 3 and the further sensor elements 3' of the same stack are all different from one another. A separate detection of red, green and blue light by individual sensor elements is thus feasible without using filters. The further sensor elements 3' may be provided with metal spacers 22 similar to the metal spacers 22 of the filter elements 11, 12, 13 in the embodiment according to FIG. 1.

Figure 5:
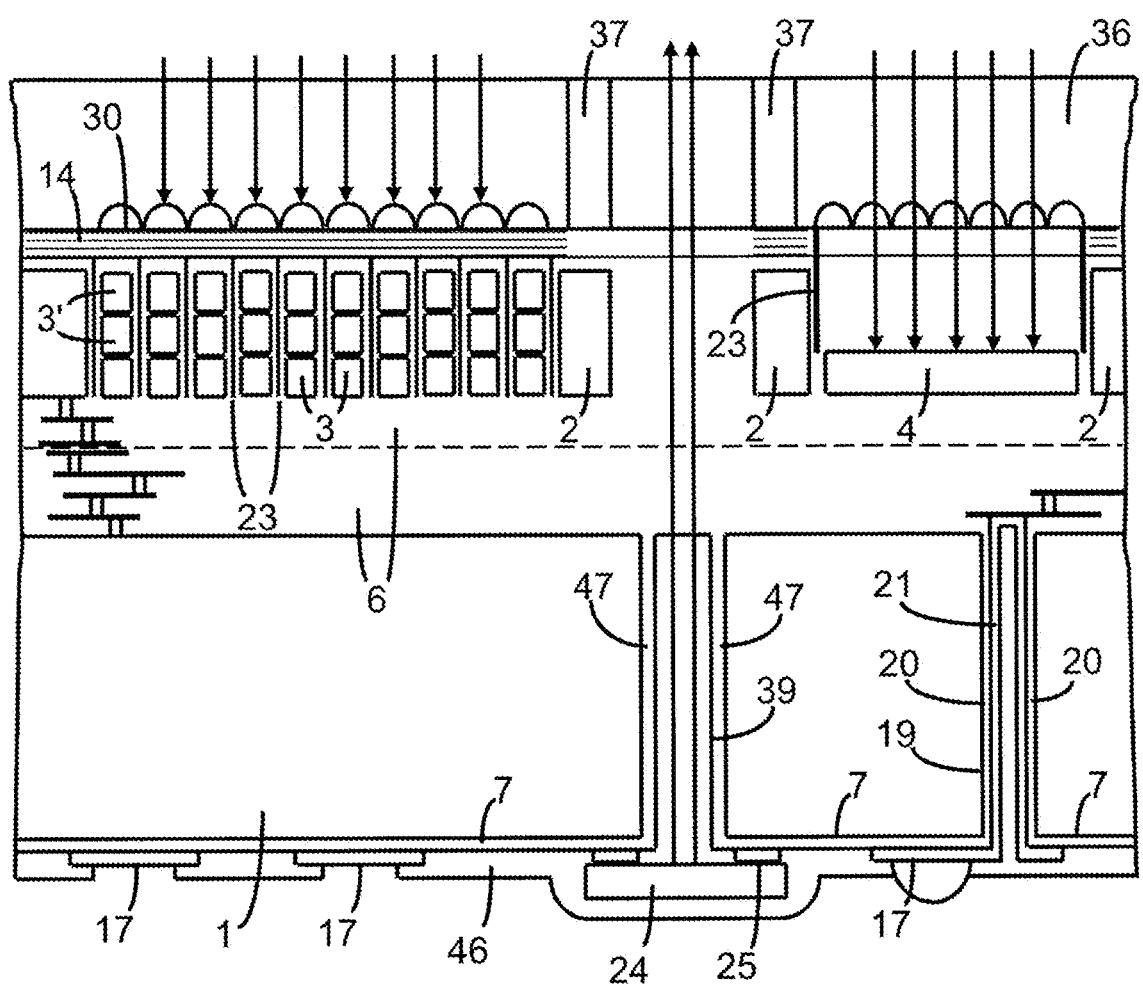
FIG. 5 is a cross section of a system-on-chip camera with sensor stacks, light sensor, optical via and molding material.

FIG. 5 is a cross section of a further system-on-chip camera with an integrated light sensor. Elements of the embodiment according to FIG. 5 that are similar to corresponding elements of the embodiment according to FIG. 3 are designated with the same reference numerals. The embodiment according to FIG. 5 differs from the embodiment according to FIG. 3 in that, instead of filter elements, further sensor elements 3' are arranged above the sensor elements 3 as in the embodiment according to FIG. 4.

As in the system-on-chip cameras according to FIGS. 1 to 4, further types of filters may be provided in the system-on-chip camera according to FIG. 5, in particular filters protecting the integrated circuit from radiation.

Figure 6:
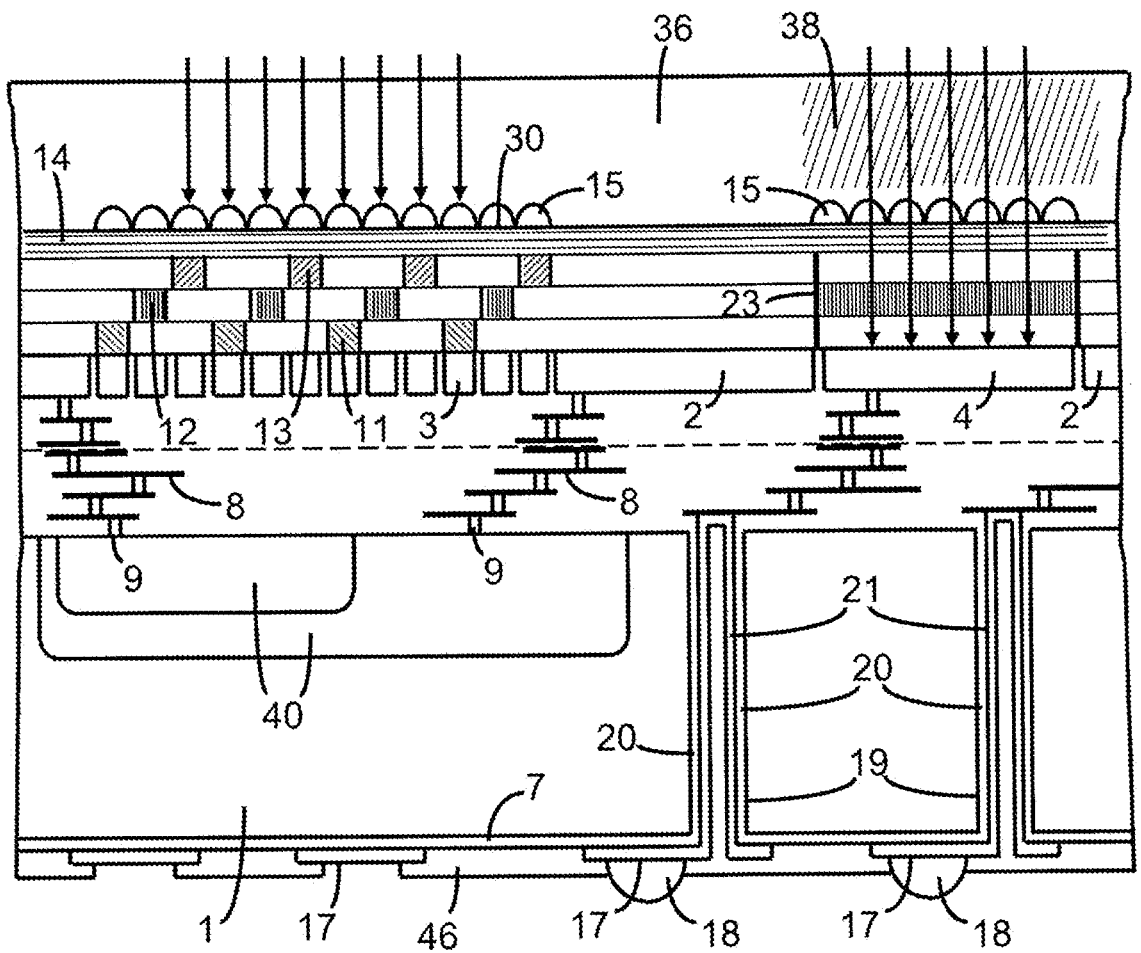
FIG. 6 is a cross section of a further system-on-chip camera with filters, light sensor, vias and molding material.

FIG. 6 is a cross section of a further system-on-chip camera with an integrated light sensor. Elements of the embodiment according to FIG. 6 that are similar to corresponding elements of the embodiment according to FIG. 1 are designated with the same reference numerals. The embodiment according to FIG. 6 is not provided with an optical component 24. It comprises an optical confinement 23 as described above in conjunction with the embodiment according to FIG. 3 and a molding material 36 including a diffusor 38 as described above in conjunction with the embodiment according to FIG. 1. In the embodiment according to FIG. 6, the UV IR blocking filter 14 extends over the light sensor 4. The UV IR blocking filter 14 may instead be recessed as in the embodiments according to FIGS. 1 to 5. A further filter 48 may be arranged above the light filter 4 as in the embodiment according to FIG. 2.

Figure 7:
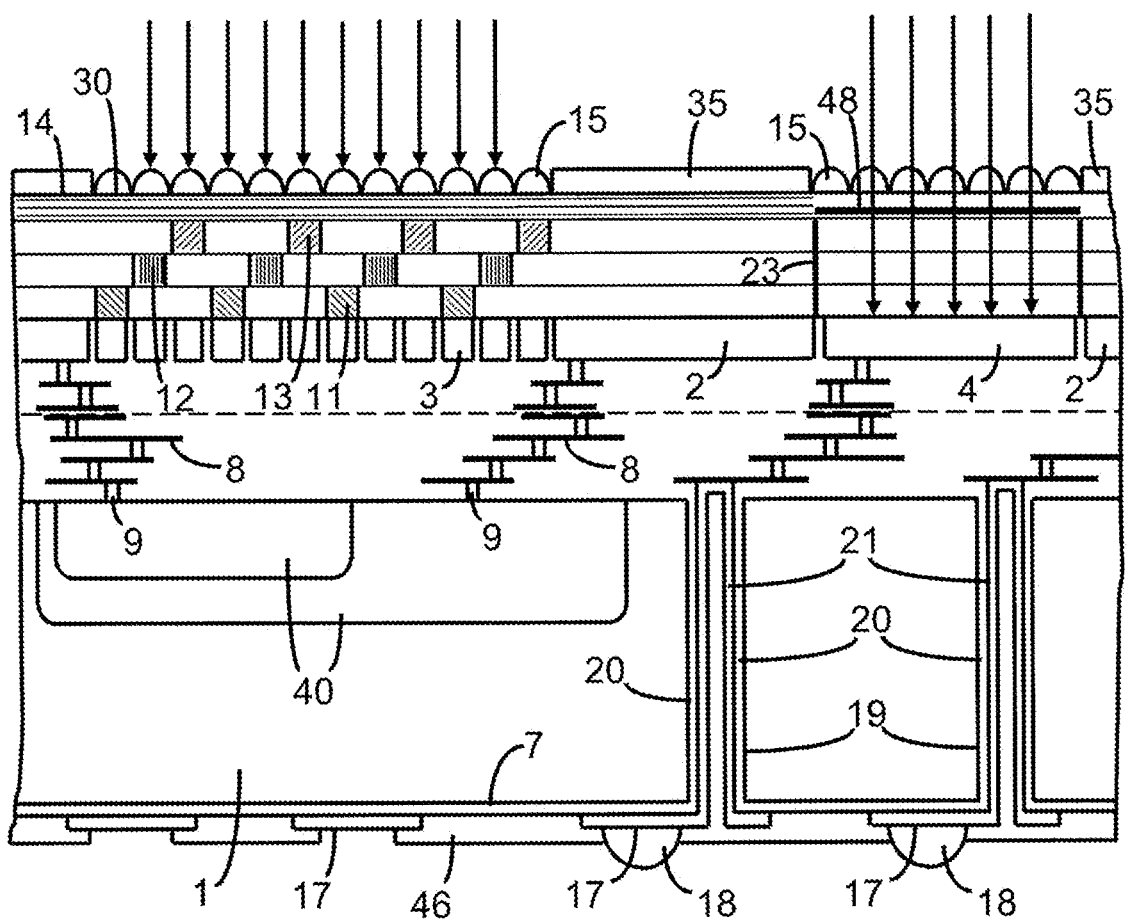
FIG. 7 is a cross section of a system-on-chip camera with filters, light sensor and vias.

FIG. 7 is a cross section of a further system-on-chip camera with an integrated light sensor. Elements of the embodiment according to FIG. 7 that are similar to corresponding elements of the embodiment according to FIG. 6 are designated with the same reference numerals. The embodiment according to FIG. 7 is not provided with a molding material. If the lens 15 or array of lenses 15 is formed in a lens layer 35, portions of the lens layer 35 may also remain in areas that are not occupied by the lens 15 or array of lenses 15, as shown in FIG. 7. In a further embodiment the lens 15 or array of lenses 15 may only be arranged above the array of sensor elements 3, but not above the light sensor 4, while the other features are the same as in the embodiment according to FIG. 7. In the embodiment according to FIG. 7 a further filter 48 is arranged above the light sensor 4, as in the embodiments according to FIGS. 2 and 4.

Figure 8:
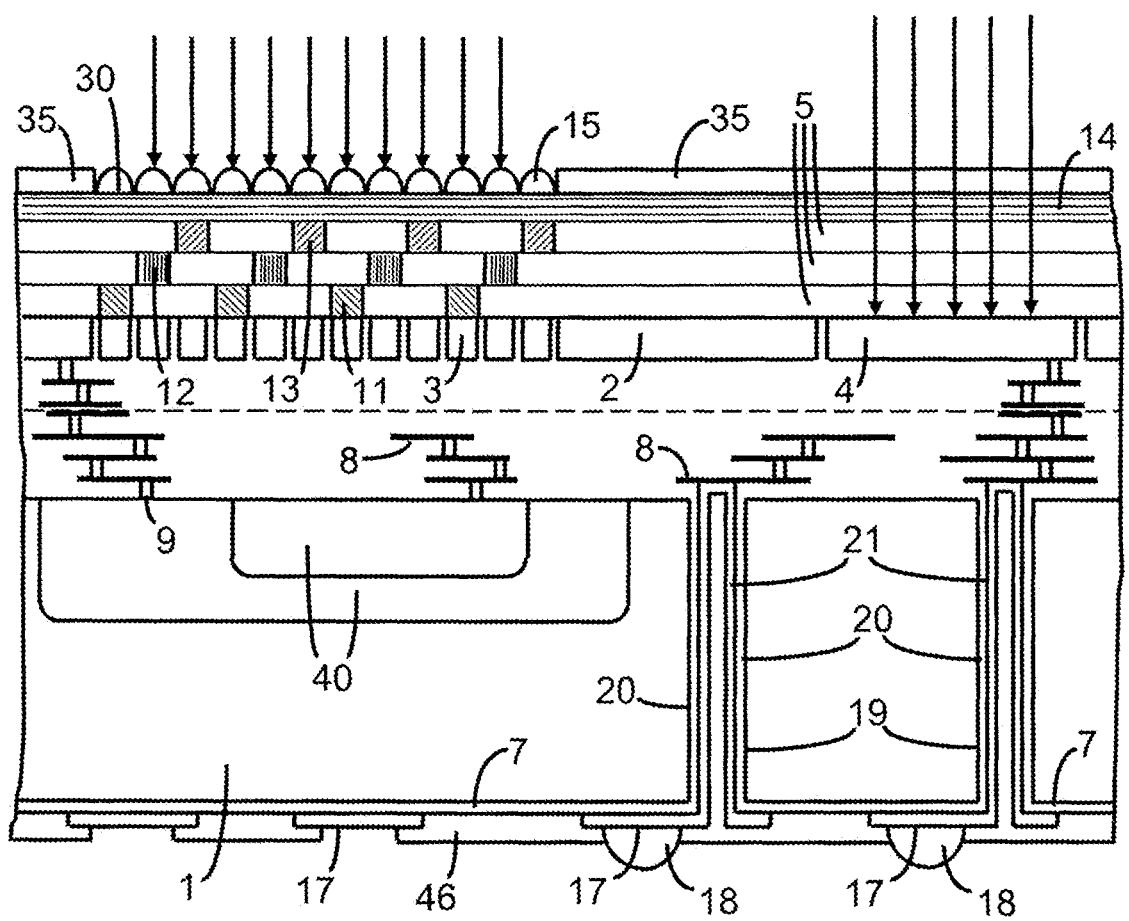
FIG. 8 is a cross section of a further system-on-chip camera with filters, light sensor and vias.

FIG. 8 is a cross section of a further system-on-chip camera with an integrated light sensor. Elements of the embodiment according to FIG. 8 that are similar to corresponding elements of the embodiment according to FIG. 7 are designated with the same reference numerals. The embodiment according to FIG. 8 is not provided with an optical confinement 23. The lens 15 or array of lenses 15 is arranged above the array of sensor elements 3, but not above the light sensor 4.

Figure 9:
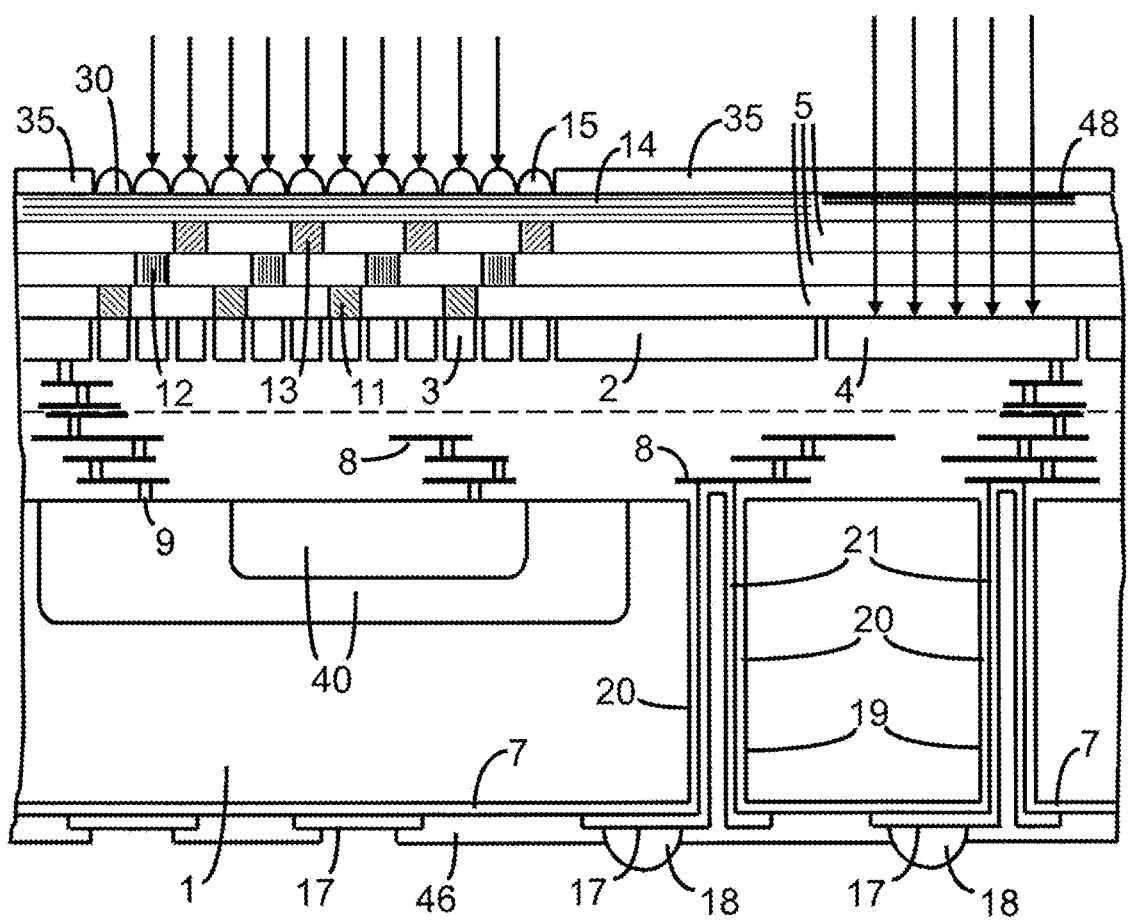
FIG. 9 is a cross section according to FIG. 8 for a system-on-chip camera with a different filter.

FIG. 9 is a cross section of a further system-on-chip camera with an integrated light sensor. Elements of the embodiment according to FIG. 9 that are similar to corresponding elements of the embodiment according to FIG. 8 are designated with the same reference numerals. In the system-on-chip camera according to FIG. 9, the UV IR blocking filter 14 is recessed above the light sensor 4, and a further filter 48 is arranged above the light sensor 4. The further filter 48 may especially be an IR pass filter, which allows infrared radiation to reach the light sensor 4, and/or a UV blocking filter, which prevents ultraviolet radiation from reaching the light sensor 4.

Figure 10:
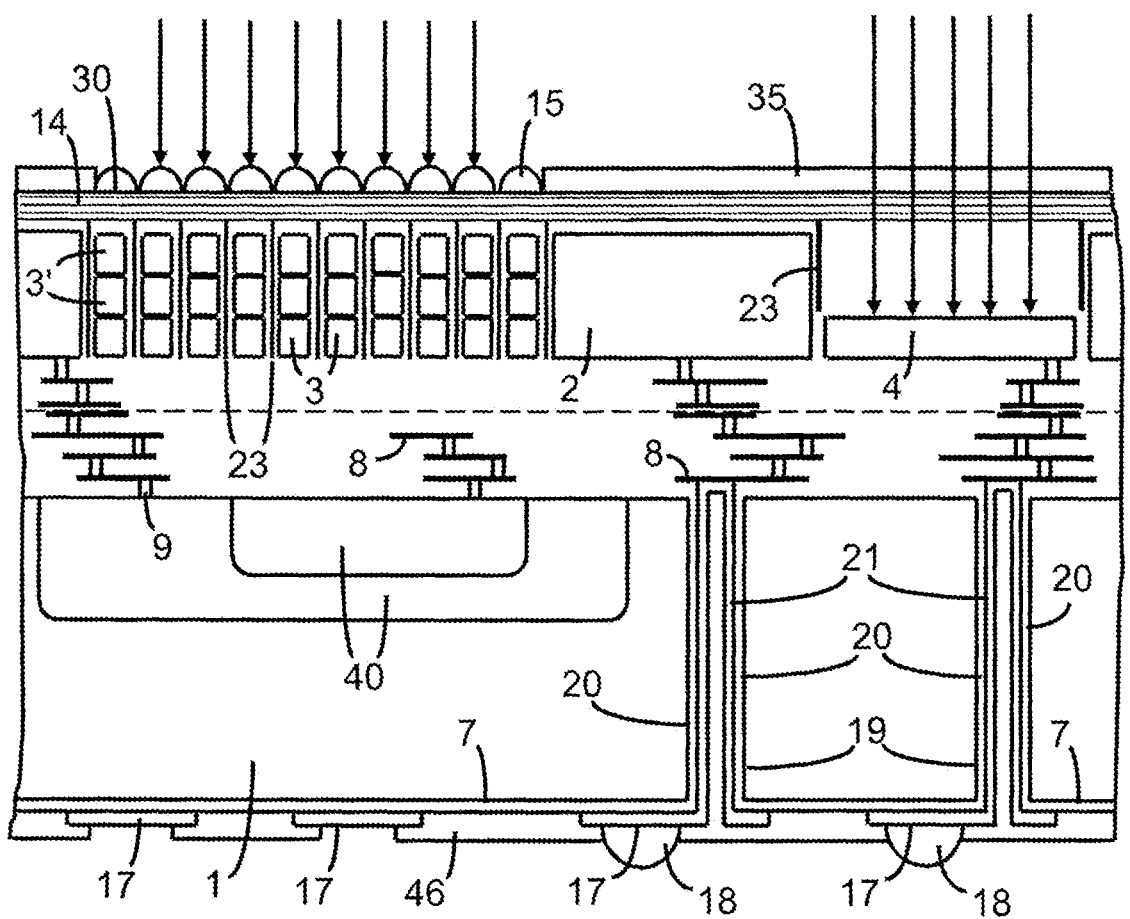
FIG. 10 is a cross section of a system-on-chip camera with sensor stacks, light sensor and vias.

FIG. 10 is a cross section of a further system-on-chip camera with an integrated light sensor. Elements of the embodiment according to FIG. 10 that are similar to corresponding elements of the embodiment according to FIG. 8 are designated with the same reference numerals. The embodiment according to FIG. 10 comprises an optical confinement 23 as described above in conjunction with the embodiment according to FIG. 3. The array of sensor elements 3 is provided with further sensor elements 3' as in the embodiment according to FIG. 4.

Figure 11:
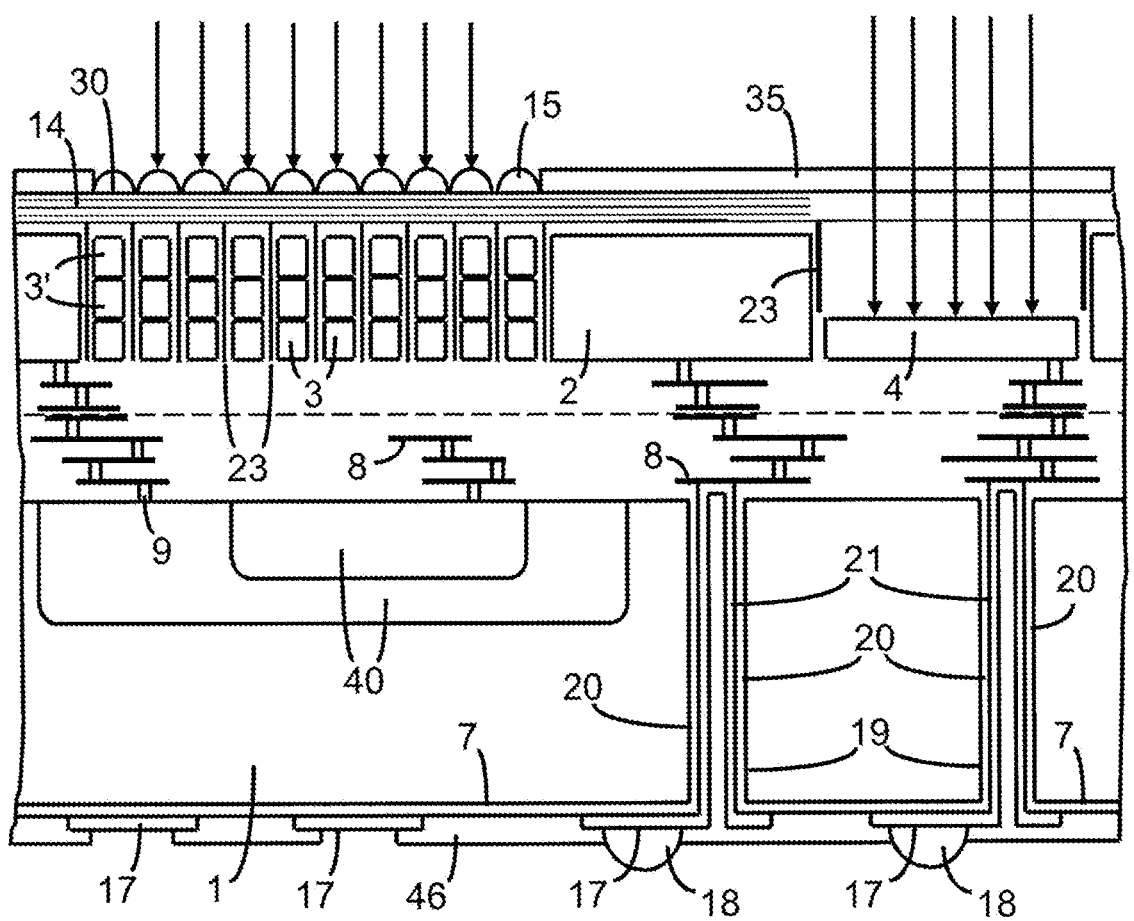
FIG. 11 is a cross section according to FIG. 10 for a system-on-chip camera with a different filter.

FIG. 11 is a cross section of a further system-on-chip camera with an integrated light sensor. Elements of the embodiment according to FIG. 11 that are similar to corresponding elements of the embodiment according to FIG. 10 are designated with the same reference numerals. The embodiment according to FIG. 11 does not comprise a filter above the light sensor 4. The optional UV IR blocking filter is recessed above the light sensor 4.

Further embodiments can be derived from the variety of embodiments according to FIGS. 1 to 11. The array of sensor elements 3 may be provided with filter elements 11, 12, 13 or further sensor elements 3'. The molding material 36 with or without optical isolation 37 or diffusor 38, the filter layer 10, the UV IR blocking filter 14, the further filter 48, the metal spacers 22, the optical confinement 23, the optical component 24, the vias 19, 29, 39 and the lens 15 or array of lenses 15, in particular the lens 15 or array of lenses 15 above the light sensor 4, are optional and may be combined in various ways to obtain further embodiments.

Figure 12:
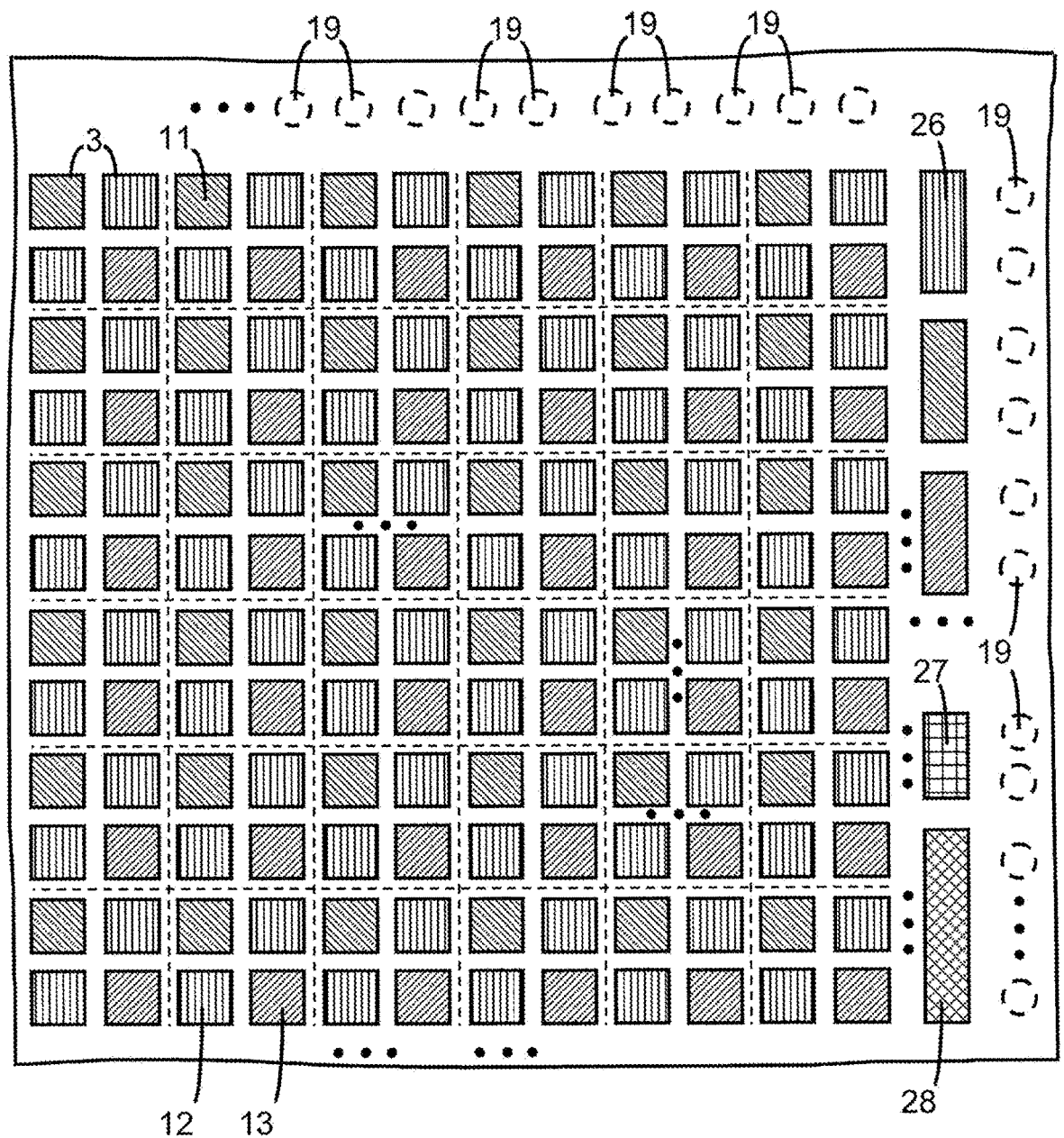
FIG. 12 is a top view of an arrangement of sensors.

FIG. 12 is a top view of an arrangement of sensors. The array of sensor elements 3 may especially be provided with filter elements 11, 12, 13 according to the pattern shown in FIG. 12. The limits between pixels are indicated with the broken vertical and horizontal lines. The different types of hatching correspond to filter elements for red, green and blue, vertical parallel lines indicating green filters. Some positions of vias 19 are schematically indicated by way of example. The vias 19 may be arranged all around and below the sensor elements and the light sensor(s) 4, as schematically indicated in FIG. 12 by triple dots. The vias 19 are favorable for providing stability by bumping. The light sensor 4 may be a color sensor 26, for instance. FIG. 12 shows color sensors 26 for red, green and blue. A light source 27 and/or a photosensor 28 may additionally be provided for various applications and purposes, including a time-of-flight sensor, for instance.

A method of producing an embodiment of the system-on-chip camera comprising interference filters will be described in the following in conjunction with FIGS. 13 to 23, which show cross sections of intermediate products.

Figure 13:
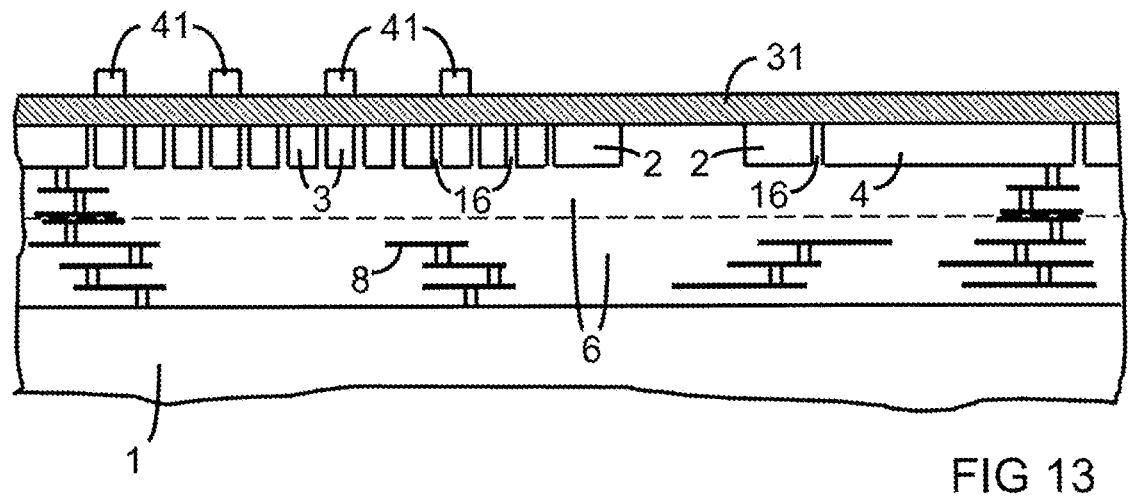
FIG. 13 is a cross section of an intermediate product after a first filter layer is applied.

FIG. 13 shows a cross section of an arrangement of the semiconductor body 1 and the sensor substrate 2 including sensor elements 3 and a light sensor 4. The semiconductor body 1 and the sensor substrate 2 are fastened to one another, especially bonded by the intermediate dielectric layer 6. A first filter layer 31, which yields filter elements of a first type 11, is arranged on the sensor substrate 2. A first mask 41 is applied on the first filter layer 31 and covers the areas where filter elements of the first type 11 are to be formed. The filter elements of the first type 11 may be red filters, for instance, especially interference filters forming band-pass filters for red.

Figure 14:
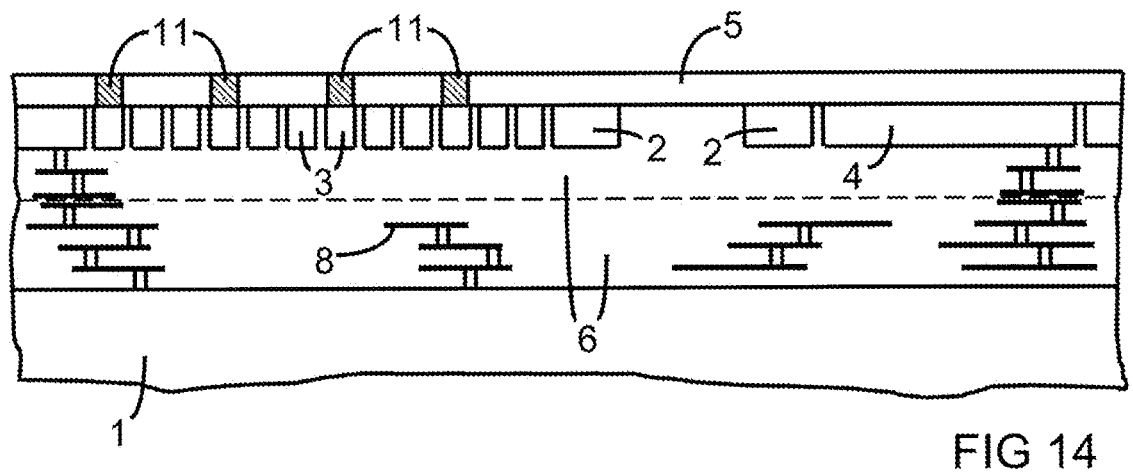
FIG. 14 is a cross section according to FIG. 13 after the first filter layer is structured and the surface is planarized.

FIG. 14 is a cross section according to FIG. 13 after filter elements of the first type 11 are formed. The first filter layer 31 shown in FIG. 13 is structured, especially etched, using the first mask 41 to form the filter elements of the first type 11. Then the surface is planarized with a suitable material, which may be the material that is provided for the front dielectric layer 5, in particular an oxide of the semiconductor material of the sensor substrate 2 like $SiO_2$, for instance.

Figure 15:
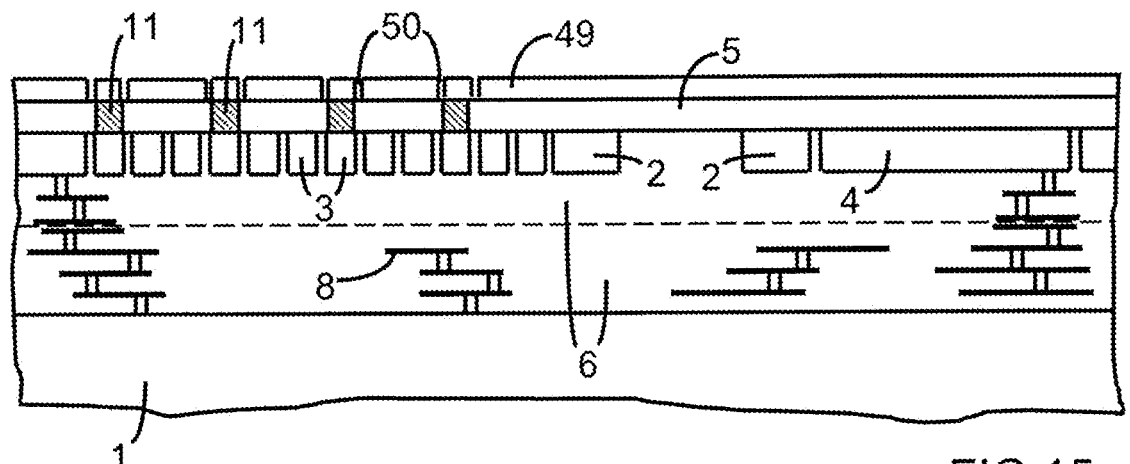
FIG. 15 is a cross section according to FIG. 14 after a mask is applied on the planarized surface.

FIG. 15 is a cross section according to FIG. 14 after a first further mask 49 is applied on the planarized surface. The first further mask 49 may be a photoresist layer, for instance. It has openings 50 in areas adjacent to the filter elements of the first type 11.

Figure 16:
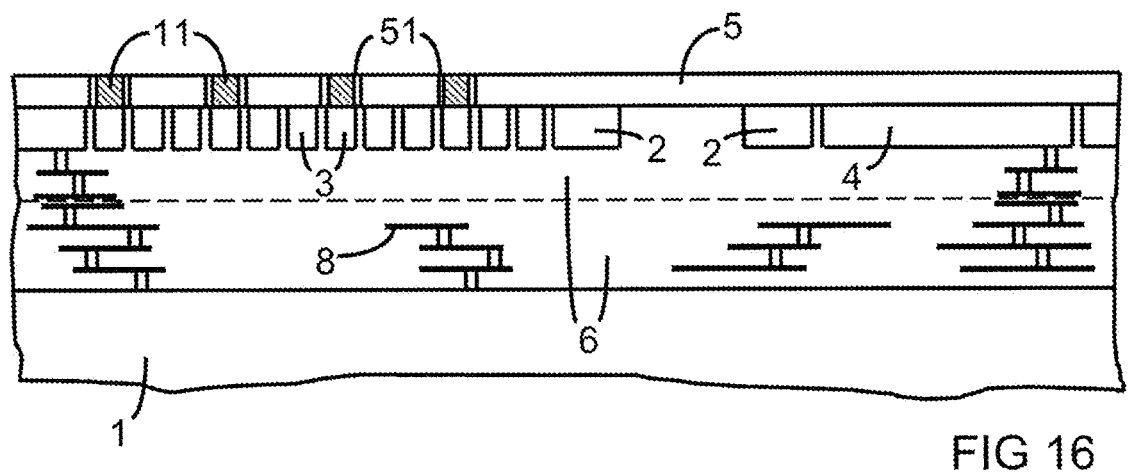
FIG. 16 is a cross section according to FIG. 15 after trenches are etched in the planarized surface.

FIG. 16 is a cross section according to FIG. 15 after trenches 51 are etched in the planarized surface. The trenches 51 are etched through the openings 50 of the first further mask 49 into the front dielectric layer 5. The trenches 51 can be formed by dry etching, for example. The first further mask 49 is subsequently removed.

Figure 17:
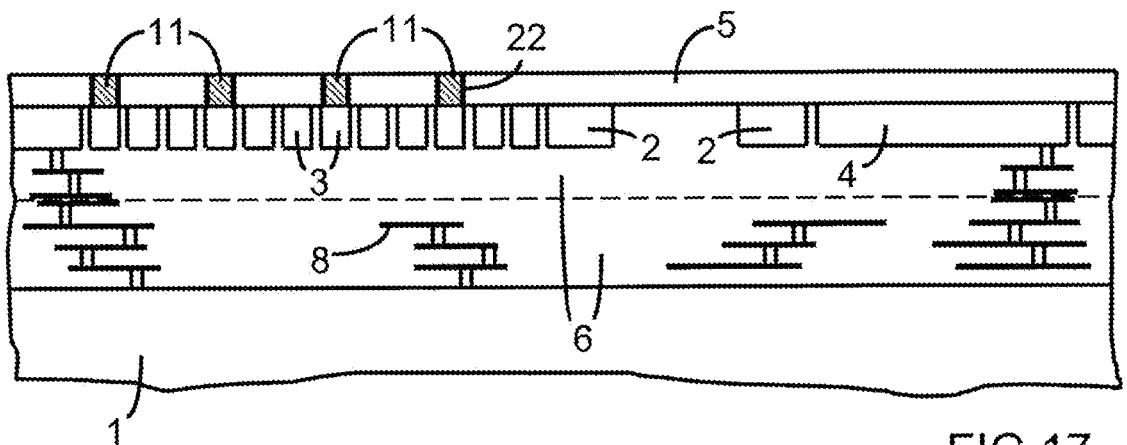
FIG. 17 is a cross section according to FIG. 16 after the trenches are filled.

FIG. 17 is a cross section according to FIG. 16 after the trenches 51 are filled with an optically shielding material, which may especially be a metal like tungsten or TiN, for instance. The trenches 51 can be filled by deposition, in particular chemical vapor deposition. A planar surface is obtained by subsequent chemical mechanical polishing or isotropic backetch, for example. Thus the spacers 22 are formed to provide apertures limiting the solid angle of incidence.

The spacers 22 can instead be formed as sidewall spacers before the front dielectric layer 5 is applied. Spacers can be formed by a conformal deposition of the material that is provided for the spacers 22 and subsequent anisotropic etching.

Figure 18:
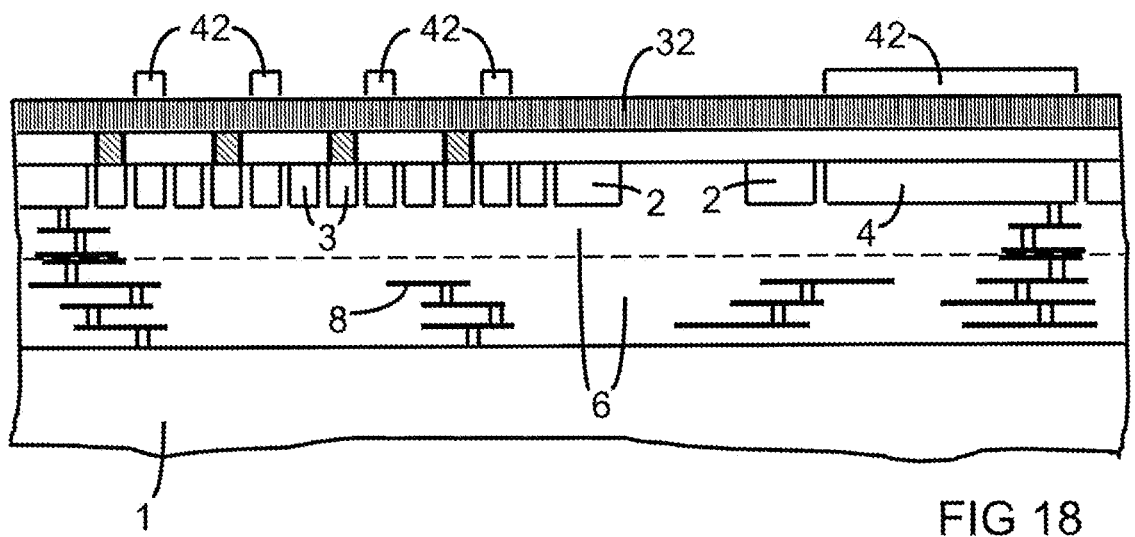
FIG. 18 is a cross section according to FIG. 17 after a second filter layer is applied.

FIG. 18 is a cross section according to FIG. 17 after a second filter layer 32 is arranged on the planarized surface. The second filter layer 32 yields filter elements of a second type 12. A second mask 42 is applied on the second filter layer 32 and covers the areas where filter elements of the second type 12 are to be formed. The filter elements of the second type 12 may be green filters, for instance, especially interference filters forming band-pass filters for green. In the example shown in FIG. 18, the second mask 42 comprises a further portion above the light sensor 4. Thus a suitable filter layer, which is a green filter in this example, can be formed above the light sensor 4 together with filter elements that are provided for the array of sensor elements 3.

Figure 19:
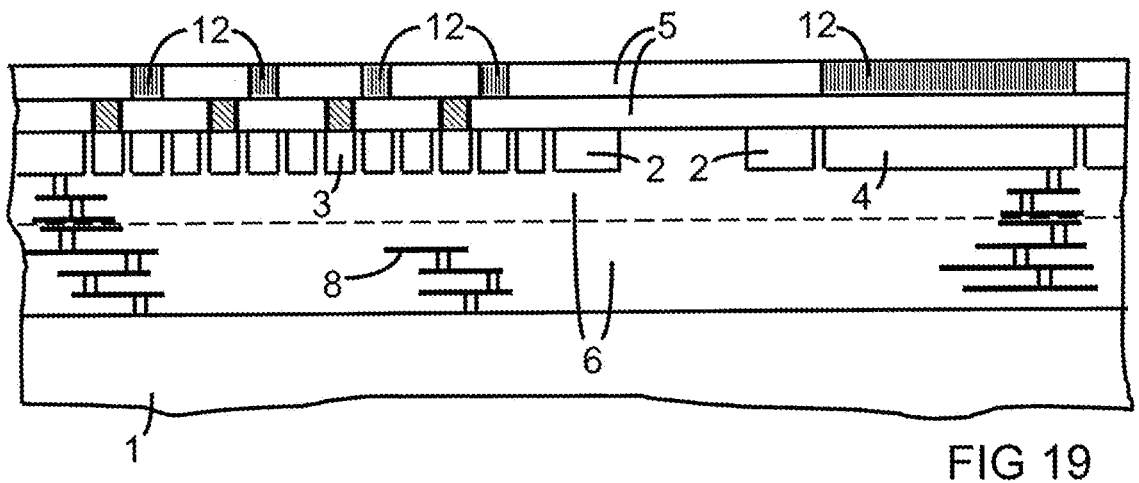
FIG. 19 is a cross section according to FIG. 18 after the second filter layer is structured and the surface is planarized.

FIG. 19 is a cross section according to FIG. 18 after filter elements of the second type 12 are formed. The second filter layer 32 shown in FIG. 18 is structured, especially etched, using the second mask 42 to form the filter elements of the second type 12. Then the surface is planarized with a suitable material, which may again be the material that is provided for the front dielectric layer 5, in particular $SiO_2$, for instance. Further metal spacers 22 can be applied to the filter elements of the second type 12 according to the above description.

Figure 20:
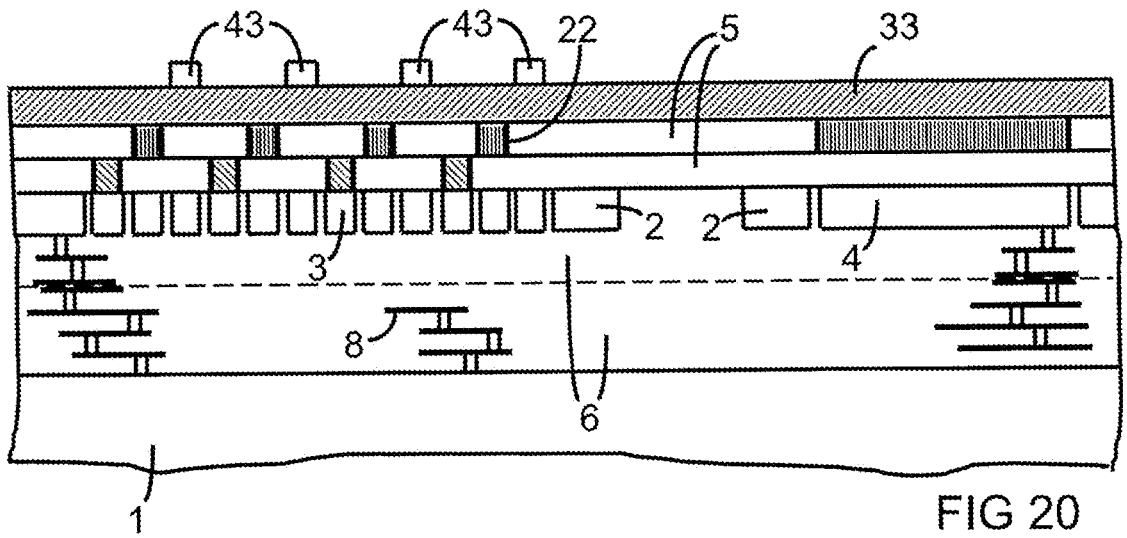
FIG. 20 is a cross section according to FIG. 19 after a third filter layer is applied.

FIG. 20 is a cross section according to FIG. 19 after the spacers 22 are formed in the layer of the filter elements of the second type 12 and a third filter layer 33 is arranged on the planarized surface. The third filter layer 33 yields filter elements of a third type 13. A third mask 43 is applied on the third filter layer 33 and covers areas where filter elements of the third type 13 are to be formed. The filter elements of the third type 13 may be blue filters, for instance, especially interference filters forming band-pass filters for blue. The order in which the filter layers 31, 32, 33 for the different types of filter elements 11, 12, 13 are applied may differ from the example given above.

Figure 21:
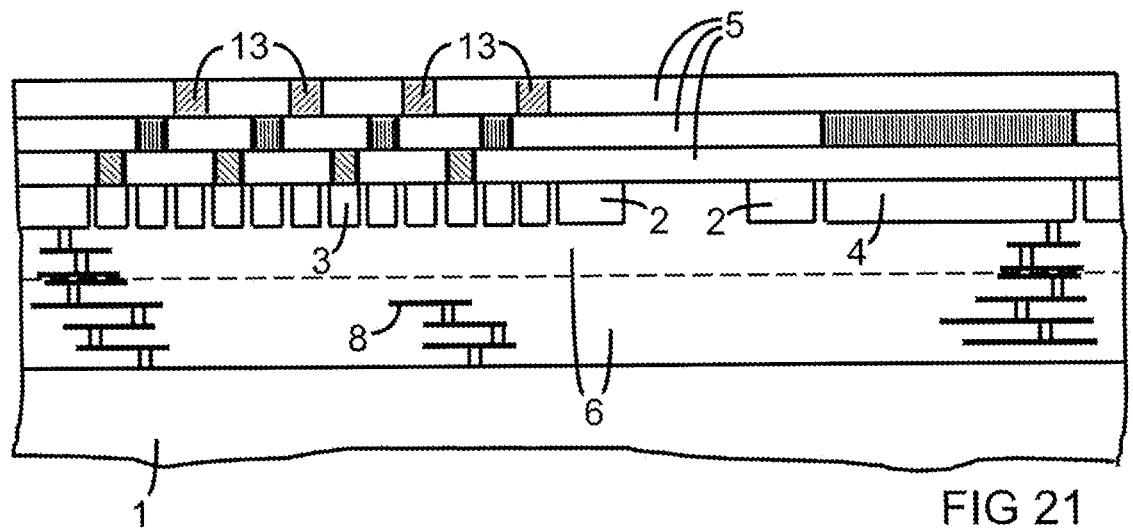
FIG. 21 is a cross section according to FIG. 20 after the third filter layer is structured and the surface is planarized.

FIG. 21 is a cross section according to FIG. 20 after filter elements of the third type 13 are formed and the surface is planarized. The third filter layer 33 shown in FIG. 20 is structured, especially etched, using the third mask 43 to form the filter elements of the third type 13. Then the surface is planarized with a suitable material, which may again be the material that is provided for the front dielectric layer 5, in particular $SiO_2$, for instance. Further metal spacers 22 can be applied to the filter elements of the third type 13 according to the above description.

Figure 22:
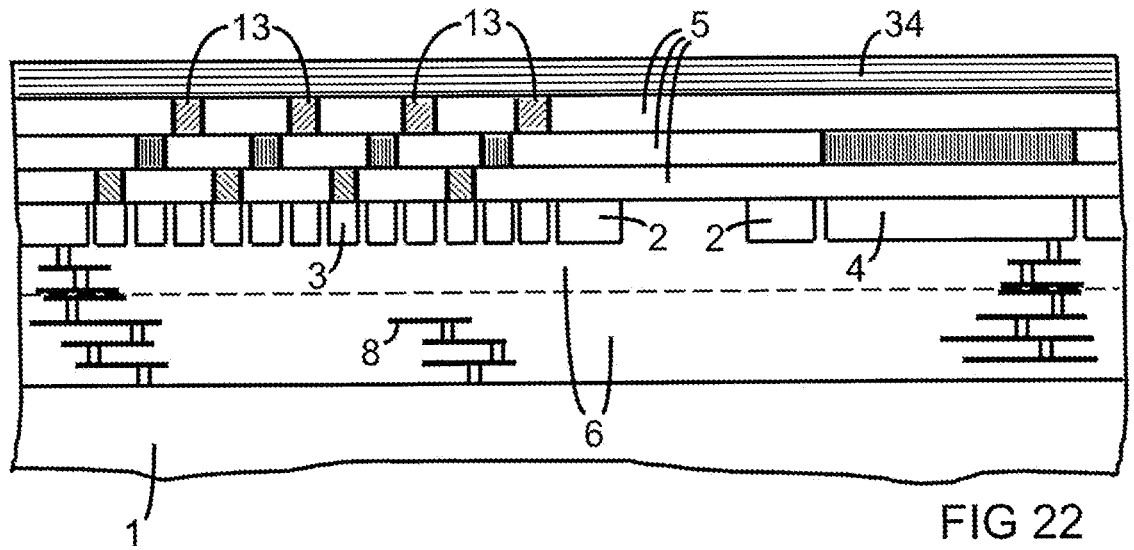
FIG. 22 is a cross section according to FIG. 21 after a blocking filter layer is applied.

FIG. 22 is a cross section according to FIG. 21 and further shows a UV IR blocking filter layer 34, which may be arranged on the planarized surface if a UV IR blocking filter 14 is desired. The UV IR blocking filter layer 34 may comprise a sequence of layers as schematically indicated in FIG. 22. The UV IR blocking filter layer 34 may be maintained as an entire layer, or it may be structured using a fourth mask 44.

Figure 23:
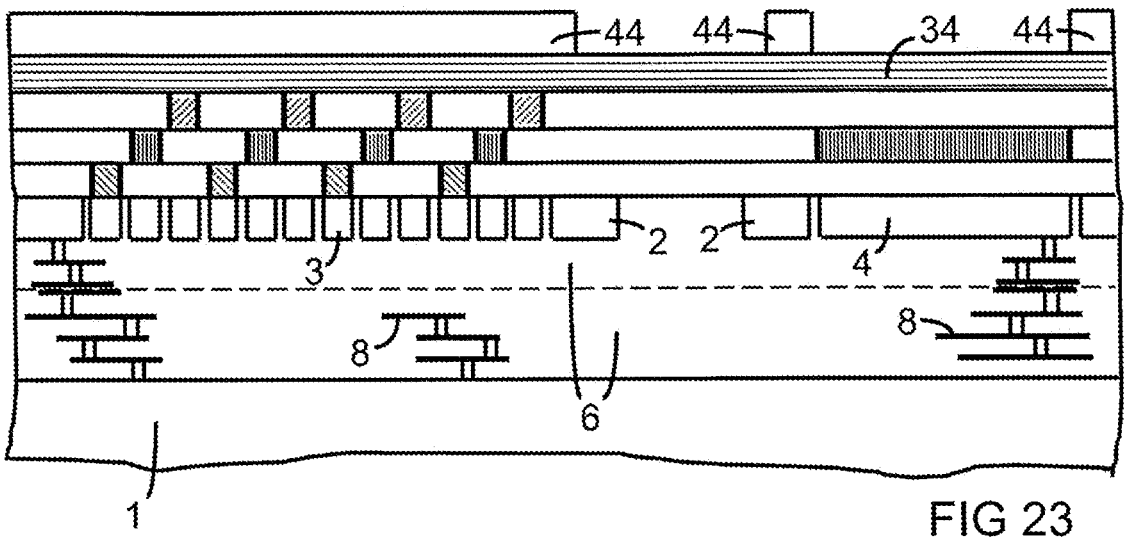
FIG. 23 is a cross section according to FIG. 22 after a further mask is applied.

FIG. 23 is a cross section according to FIG. 22 after an optional fourth mask 44 is applied. The fourth mask 44 is used to structure the UV IR blocking filter layer 34, so that the UV IR blocking filter 14 is produced, which may be accomplished by etching. Recesses thus formed in the UV IR blocking filter layer 34 are filled with suitable material, which may again be the material that is provided for the front dielectric layer 5, in particular $SiO_2$, for instance.

Figure 24:
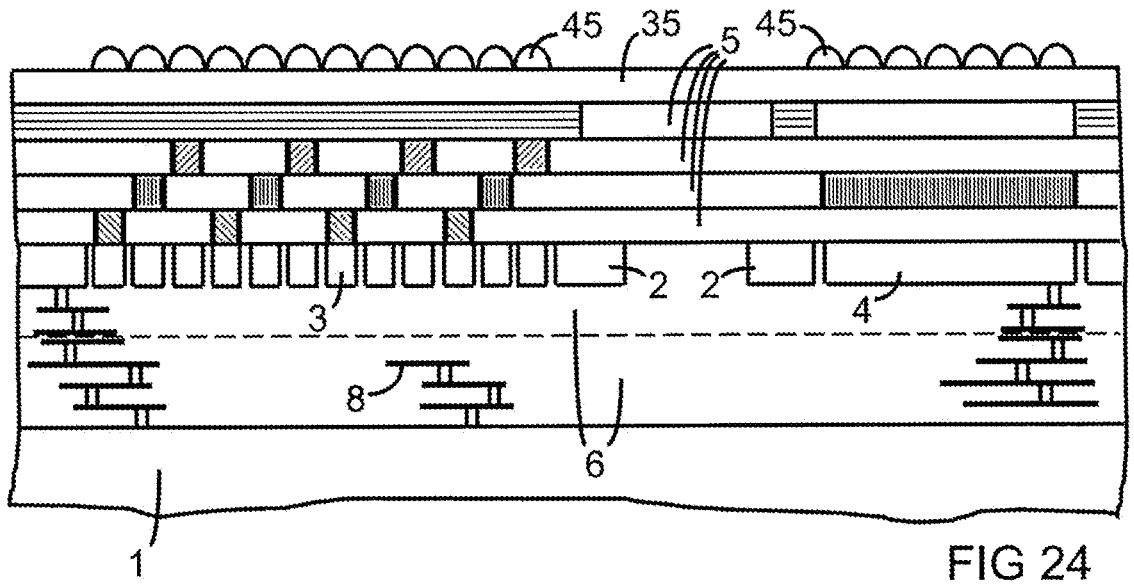
FIG. 24 is a cross section according to FIG. 23 after a lens layer and a transfer mask are applied.

FIG. 24 is a cross section according to FIG. 23 after an optional lens layer 35 is arranged on the planarized surface. The lens layer 35 may especially be an oxide of the semiconductor material of the sensor substrate 2, in particular $SiO_2$, for instance. A transfer mask 45 is applied, which has the shape of the lens 15 or array of lenses 15 that is to be formed. The transfer mask 45 may be a structured and annealed resist layer, for instance. The shape of the transfer mask 45 is transferred to the lens layer 35, in particular by etching. This technique of transferring a surface structure of an upper layer to a lower layer is known per se. The use of a lens layer and a transfer mask is only one way of producing a lens or array of lenses. The method is not restricted to this variant, and any other conventional method can be employed to produce a lens or array of lenses.

Figure 25:
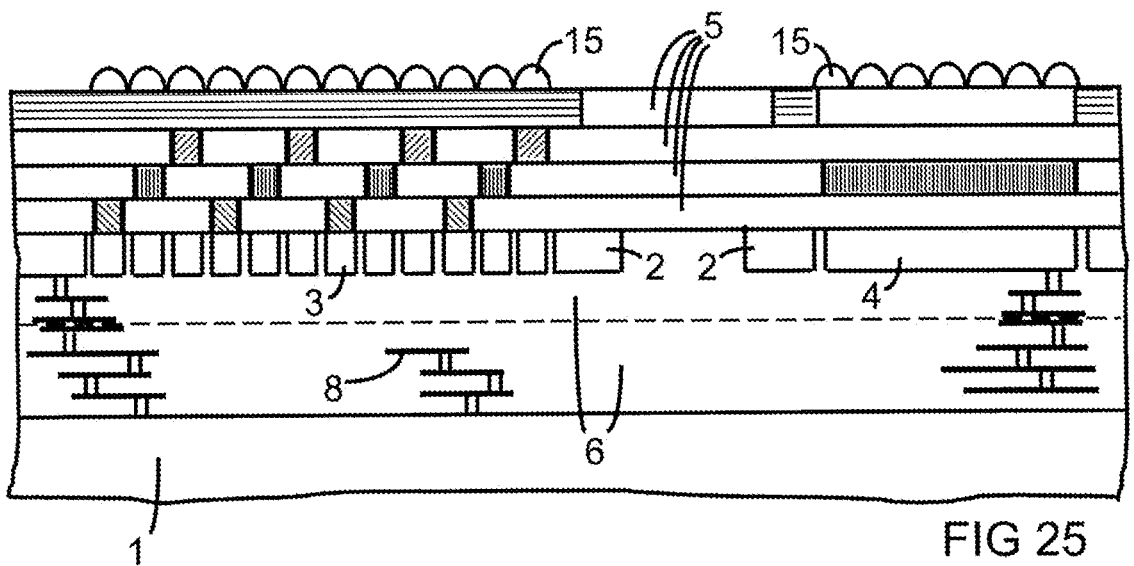
FIG. 25 is a cross section according to FIG. 24 after lenses are formed.

FIG. 25 is a cross section according to FIG. 24 after the lens 15 or array of lenses 15 is formed. The transfer mask 45 is completely removed during or after the etching process. In the example shown in FIG. 25, the lens layer 35 has been removed from all areas outside the area occupied by the lens 15 or array of lenses 15. Instead, portions of the lens layer 35 may remain in an area that is not occupied by the lens 15 or array of lenses 15, as in the embodiments according to FIGS. 7, 8, 9, 10 and 11.

Figure 26:
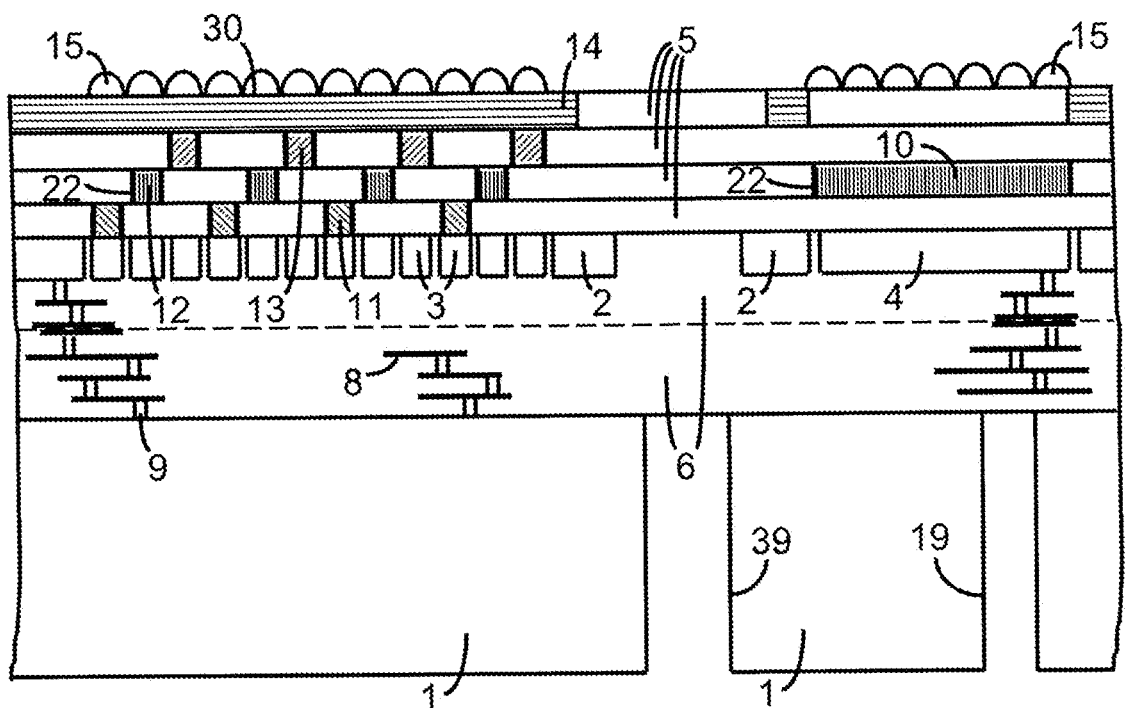
FIG. 26 is a cross section according to FIG. 25 after via holes are formed in the semiconductor body.

FIG. 26 is a cross section according to FIG. 25 after the formation of via holes in the semiconductor body 1. The via hole 19 is provided for an electric interconnection through the semiconductor body 1. An optical via 39 may be provided for a further optical component. It may be suitable if the sensor substrate 2 is recessed above the optical via 39 as shown in FIG. 26.

Figure 27:
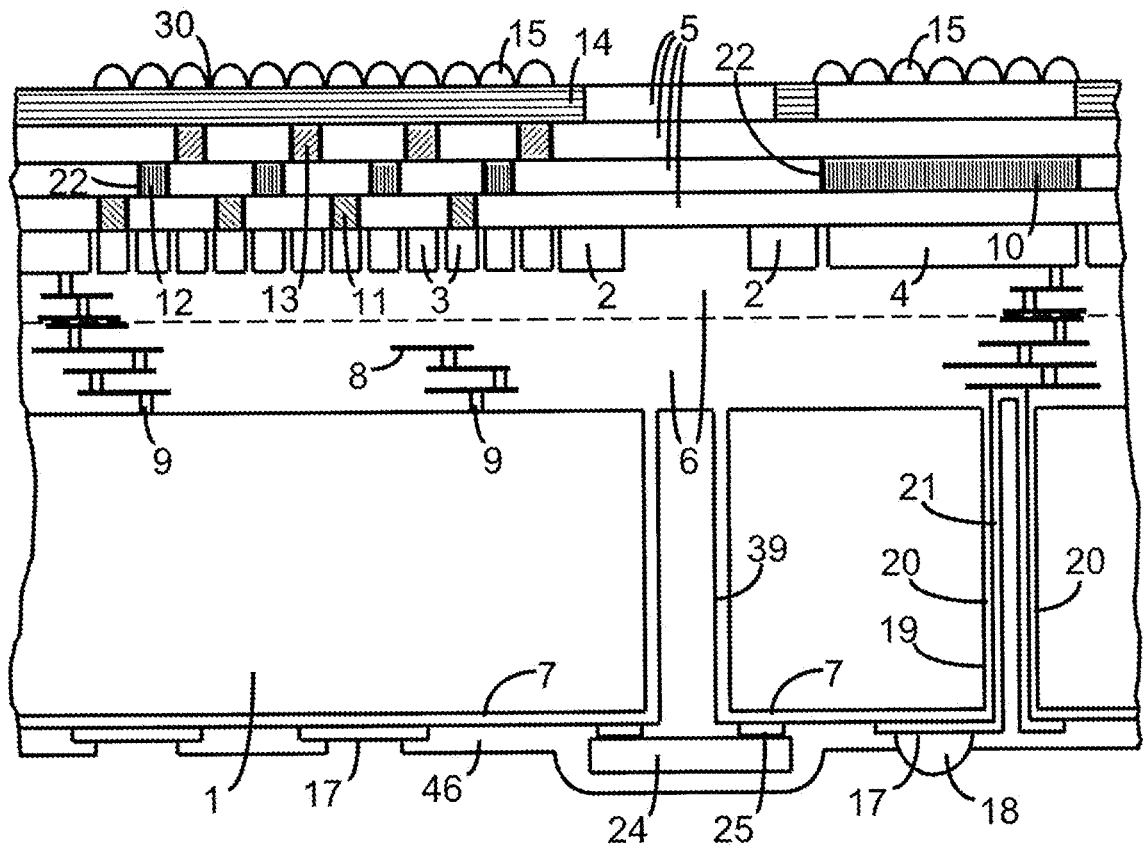
FIG. 27 is a cross section according to FIG. 26 after electrical and optical vias are formed.

FIG. 27 is a cross section according to FIG. 26 after the application of a metallization 21 for the electric interconnection through the semiconductor body 1 and the arrangement of an optical component 24 on the rear side of the semiconductor body 1. The embodiment according to FIG. 3 can then be obtained by further method steps including the application of a molding material.

The described system-on-chip camera allows to enhance the integration of optical components such as filters and lenses at wafer level and especially to reduce the size of the camera. Furthermore it facilitates the integration of multiple CMOS image sensors with discrete sensors such as ambient light sensors, color sensors and/or time-of-flight sensors, for example.

The invention claimed is:

1. A system-on-chip camera, comprising:
a sensor substrate comprising semiconductor material;
sensor elements arranged in the sensor substrate according to an array of pixels;
a light sensor in the sensor substrate apart from the sensor elements; and
a surface of incidence above the sensor elements and the light sensor;
the sensor substrate being connected to a semiconductor body comprising an integrated circuit, and the sensor substrate being arranged between the semiconductor body and the surface of incidence;
a metallization layer between the semiconductor body and the sensor substrate;
an optical component above the surface of incidence; and
a through-substrate interconnection electrically connecting the metallization layer and the optical component; and
each of the sensor elements being provided with a further component arranged between a respective sensor element and the surface of incidence, the further component being a stack of further sensor elements arranged in the sensor substrate and providing a different spectral sensitivity than the sensor elements, and the sensor elements and the further sensor elements being arranged at different distances from the surface of incidence.

2. The system-on-chip camera according to claim 1, further comprising:
metal spacers laterally arranged at the further sensor elements.

3. The system-on-chip camera according to claim 1, further comprising:
a filter layer arranged between the light sensor and the surface of incidence, the filter layer being a band-pass filter for either red, green or blue light.

4. The system-on-chip camera according to claim 1, further comprising:
a lens or an array of lenses formed by an oxide of semiconductor material arranged on the surface of incidence.

5. The system-on-chip camera according to claim 4, further comprising:
a molding material covering the lens or array of lenses, and
a diffusor formed above the light sensor by a modified region of the molding material.

6. The system-on-chip camera according to claim 1, further comprising:
a metallization layer between the semiconductor body and the sensor substrate;
a contact pad, the semiconductor body being arranged between the metallization layer and the contact pad;
a via hole in the semiconductor body; and
a metallization in the via hole, the metallization electrically connecting the metallization layer and the contact pad.

7. The system-on-chip camera according to claim 1, further comprising:
an optical via penetrating the semiconductor body, and
an optical component opposite the optical via on a side facing away from the sensor substrate.

8. The system-on-chip camera according to claim 1, wherein the light sensor is a sensor selected from the group consisting of an ambient light sensor, a color sensor, a hyperspectral sensor with multiple pixels or bands, an infrared sensor and a UV sensor.

9. The system-on-chip camera according to claim 1, further comprising:
a proximity sensor, a gesture sensor or a time-of-flight sensor including a light source.

10. The system-on-chip camera according to claim 1, wherein the light sensor comprises an array of light sensors serving as a further camera.

11. A method of producing a system-on-chip camera, comprising:
providing a semiconductor body with an integrated circuit;
providing a sensor substrate with sensor elements, the sensor elements forming an array of pixels, and with a light sensor apart from the sensor elements;
fastening the sensor substrate to the semiconductor body; and
forming at least two groups of filter elements, each of the groups of filter elements being formed by:
arranging a respective continuous filter layer on a respective planar surface above the sensor substrate,
applying a respective mask on the filter layer, the mask covering areas provided for the group of filter elements,
structuring the filter layer using the mask such that a respective non-planar surface is formed, and
planarizing the non-planar surface such that a respective planarized surface is formed.

12. The method of claim 11, further comprising:
arranging an ultraviolet (UV) infrared (IR) blocking filter layer on one of the planarized surfaces after the last filter layer is structured;
applying a further mask on the UV IR blocking filter layer so that a further non-planar surface is formed;
structuring the UV IR blocking filter layer using the further mask; and
planarizing the further non-planar surface such that a further planarized surface is formed.

13. The method of claim 11, further comprising:
arranging a lens layer above the sensor substrate;
applying a transfer mask on the lens layer, the transfer mask having a shape of a lens or an array of lenses; and forming the lens or an array of lenses by transferring the shape of the transfer mask to the lens layer.

14. The method of claim 13, further comprising:
applying a molding material covering the lens or array of lenses; and
forming a diffusor above the light sensor by modifying the molding material in a region above the light sensor.

15. The method of claim 11, further comprising:
forming metal spacers at the filter elements by etching trenches in at least one of the planarized surfaces and filling the trenches with a metal.

16. The method of claim 11, wherein planarizing the non-planar surface comprises filling gaps at the non-planar surface with a material.

17. The method of claim 11, wherein filter elements of a first type are arranged at a distance from a surface of incidence that is different from (i) a distance from filter elements of a second type from the surface of incidence and/or (ii) a distance from filter elements of a third type from the surface of incidence.

18. A method of producing a system-on-chip camera, comprising:
providing a semiconductor body with an integrated circuit;
providing a sensor substrate with sensor elements, the sensor elements forming an array of pixels, and with a light sensor apart from the sensor elements such that a surface of incidence is above the sensor elements and the light sensor;
providing a further component arranged between each of the sensor element and the surface of incidence, the further component being a stack of further sensor elements arranged in the sensor substrate, wherein the sensor elements and the further sensor elements are arranged at different respective distances from the surface of incidence and wherein the sensor elements provide a different spectral sensitivity than the further sensor elements;
providing an optical component above the surface of incidence;
fastening the sensor substrate to the semiconductor body such that the sensor substrate is arranged between the semiconductor body and the surface of incidence and a metallization layer is arranged between the semiconductor body and the sensor substrate;
arranging a lens or an array of lenses above the sensor substrate; and
arranging a through-substrate interconnection electrically connecting the metallization layer and the optical component.

* * * * *